United States Patent
Imaizumi et al.

(10) Patent No.: US 9,941,182 B2
(45) Date of Patent: Apr. 10, 2018

(54) ELECTRONIC DEVICE AND METHOD FOR MANUFACTURING SAME

(71) Applicant: DENSO CORPORATION, Kariya-city, Aichi-pref. (JP)

(72) Inventors: Norihisa Imaizumi, Kariya (JP); Yuuki Sanada, Kariya (JP); Masayuki Takenaka, Kariya (JP); Shinya Uchibori, Kariya (JP); Kengo Oka, Kariya (JP); Tasuke Fukuda, Kariya (JP); Keitarou Nakama, Kariya (JP)

(73) Assignee: DENSO CORPORATION, Kariya (JP)

( * ) Notice: Subject to any disclaimer, the term of this patent is extended or adjusted under 35 U.S.C. 154(b) by 2 days.

(21) Appl. No.: 14/894,637

(22) PCT Filed: Jun. 3, 2014

(86) PCT No.: PCT/JP2014/002924
§ 371 (c)(1),
(2) Date: Nov. 30, 2015

(87) PCT Pub. No.: WO2014/203477
PCT Pub. Date: Dec. 24, 2014

(65) Prior Publication Data
US 2016/0104653 A1   Apr. 14, 2016

(30) Foreign Application Priority Data

Jun. 21, 2013   (JP) .................................. 2013-130304
Mar. 27, 2014   (JP) .................................. 2014-065942

(51) Int. Cl.
*H01L 29/49* (2006.01)
*H01L 23/31* (2006.01)
(Continued)

(52) U.S. Cl.
CPC ........ *H01L 23/3121* (2013.01); *H01L 21/561* (2013.01); *H01L 23/49838* (2013.01);
(Continued)

(58) Field of Classification Search
CPC ............... H01L 23/3121; H01L 21/561; H01L 23/49838; H01L 24/97; H01L 25/00; H01L 2224/32225; H01L 2224/48227
See application file for complete search history.

(56) References Cited

U.S. PATENT DOCUMENTS 5,834,336 A * 11/1998 Maheshwari ....... H01L 23/3121
257/E23.065
6,288,904 B1 * 9/2001 Houdeau .......... G06K 19/07745
257/668
(Continued)

FOREIGN PATENT DOCUMENTS

JP   H01-175240 A   7/1989
JP   H09-321088 A   12/1997
(Continued)

OTHER PUBLICATIONS

International Search Report and Written Opinion of the International Searching Authority dated Aug. 19, 2014 issued in the corresponding International application No. PCT/JP2014/002924 (and English translation).

*Primary Examiner* — Michael Shingleton
(74) *Attorney, Agent, or Firm* — Posz Law Group, PLC

(57) ABSTRACT

In a substrate, at least one lateral surface between one surface and another surface is a cut surface that is cut together with mold resin. The mold resin, which is cut together with the substrate, is provided with a surface that is flush with the cut surface. A portion of the mold resin constituting the surface flush with the cut surface has a surface that is joined to the surface flush with the cut surface and parallel to the one surface of the substrate; this portion (Continued)

is thinner than a portion that seals electronic parts. Consequently, the mold resin is cut with a dicing blade brought into contact with a surface parallel to the one surface of the substrate.

4 Claims, 20 Drawing Sheets

(51) Int. Cl.
*H01L 25/00* (2006.01)
*H01L 21/56* (2006.01)
*H01L 23/00* (2006.01)
*H01L 23/498* (2006.01)

(52) U.S. Cl.
CPC .............. *H01L 24/97* (2013.01); *H01L 25/00* (2013.01); *H01L 2224/32225* (2013.01); *H01L 2224/48227* (2013.01); *H01L 2224/73265* (2013.01); *H01L 2224/97* (2013.01); *H01L 2924/13055* (2013.01); *H01L 2924/13091* (2013.01); *H01L 2924/181* (2013.01); *H01L 2924/19105* (2013.01)

(56) References Cited

U.S. PATENT DOCUMENTS

| 9,362,212 B1 * | 6/2016 | Xu .................... H01L 23/49537 |
| 9,443,830 B1 * | 9/2016 | Axelowitz .......... H01L 25/0657 |
| 2002/0039811 A1 | 4/2002 | Fujisawa |
| 2007/0085237 A1 | 4/2007 | Onishi |
| 2012/0286411 A1 | 11/2012 | Watanabe et al. |
| 2013/0037966 A1 | 2/2013 | Qiu et al. |

FOREIGN PATENT DOCUMENTS

| JP | H11-074295 A | 3/1999 |
| JP | 2000-040711 A | 2/2000 |
| JP | 2002-190565 A | 7/2002 |
| JP | 2003-204018 A | 7/2003 |
| JP | 2007-281207 A | 10/2007 |
| JP | 2008-082768 A | 4/2008 |
| JP | 2009-032842 A | 2/2009 |
| JP | 2010-101885 A | 5/2010 |
| WO | 2006/129926 A1 | 12/2006 |

* cited by examiner

ELECTRONIC DEVICE AND METHOD FOR MANUFACTURING SAME

CROSS REFERENCE TO RELATED APPLICATIONS

The present disclosure is a U.S. national stage application of International Patent Application No. PCT/JP2014/002924 filed on Jun. 3, 2014 and is based on Japanese Patent Application No. 2013-130304 filed on Jun. 21, 2013, and Japanese Patent Application No. 2014-65942 filed on Mar. 27, 2014, the disclosures of which are incorporated herein by reference.

TECHNICAL FIELD

The present disclosure relates to an electronic device where electronic parts are mounted on one surface of a substrate and the electronic parts and the one surface of the substrate are sealed with mold resin. The present disclosure also relates to a method for manufacturing the electronic device.

BACKGROUND

A method for manufacturing the above type of electronic device is conventionally proposed like in Patent Literature 1 as follows.

A multiple substrate is prepared by integrally coupling a plurality of substrates and zoned with dicing lines; then, electronic parts are mounted on one surface of each substrate of the multiple substrate. Mold resin is formed to seal the electronic parts and the one surface of the multiple substrate. Here, a groove is formed in a portion of the mold resin that is positioned over the dicing lines; the groove is tapered from its opening toward the direction of depth. That is, a groove having a V-shaped cross-section is formed in a portion of the mold resin that is positioned over the dicing lines. The multiple substrate on which the mold resin is disposed along the dicing lines (groove) is then cut with a dicing blade. This results in manufacturing an electronic device, which is mounted with the electronic parts on the one surface of each substrate while the electronic parts and the one surface of each substrate are sealed with the mold resin. When the multiple substrate is to be cut with the dicing blade, the direction of cutting is made parallel to the normal line to the one surface of the multiple substrate.

In marked contrast to a method in which the thickness of mold resin is fixed, the above manufacturing method reduces the amount of mold resin to be cut by a dicing blade, thereby shortening the time required for cutting.

PATENT LITERATURE

Patent Literature 1: JP 2002-110718 A (US 2002/003981 A1)

SUMMARY

The above manufacturing method need form a groove having a V-shaped cross-section. The sidewalls of the groove are thus tilted from the normal line to the one surface of the multiple substrate. The dicing blade is therefore brought into contact with the sidewalls of the groove, when the mold resin is to be cut with the dicing blade. However, as the sidewalls of the groove are not perpendicular to the direction of cutting, the dicing blade is likely to slip along the sidewalls of the groove. This may cause the dicing blade to meander.

The present disclosure has been made in view of the above circumstances. An object of the present disclosure is to provide an electronic device and a method for manufacturing the electronic device that inhibit a dicing blade from meandering when the dicing blade cuts mold resin.

To achieve the above object, according to an example of the present disclosure, an electronic device is provided to include a substrate, an electronics part mounted on one surface (also called a first substrate face) of the substrate, and a mold resin that seals the electronic part and the one surface of the substrate. Herein, another surface (also called a second substrate face) of the substrate opposing the one surface is exposed from the mold resin.

Further, at least one lateral surface between the one surface and the other surface of the substrate is a cut surface that is cut together with the mold resin. The mold resin has a surface that is cut together with the substrate and flush with the cut surface. The mold resin includes a portion constituting the surface flush with the cut surface, the portion having a surface that is parallel to the one surface of the substrate and is joined with the surface flush with the cut surface. This portion of the mold resin is thinner than a portion of the mold resin sealing the electronic part.

The mold resin has a surface that is cut together with the substrate, and a surface that is joined to the surface to be cut together with the substrate and parallel to one surface of the substrate. The mold resin is cut with the dicing blade brought into contact with the surface parallel to the one surface of the substrate. The direction of cutting is thus perpendicular to the surface with which the dicing blade is brought into contact. This enables to inhibit the dicing blade from meandering.

Further, according to another example of the present disclosure, a method for manufacturing an electronic device is provided as including the followings: a preparing step preparing a multiple substrate by integrating a plurality of substrates and zoning the multiple substrate with dicing lines; a mounting step mounting an electronic part onto each of the substrates on one surface of the multiple substrate; a molding step sealing the electronic part and the one surface of the multiple substrate with the mold resin; and a cutting step cutting the mold resin and the multiple substrate sealed with the mold resin from the one surface of the multiple substrate along the dicing lines with a dicing blade to divide the multiple substrate.

Further, the molding step includes integrally joining the mold resins sealing the one surfaces of the substrates at a position over the dicing line, making the portion positioned over the dicing line thinner than a portion sealing the electronic part by forming a groove at a position over the dicing line, a bottom surface of the groove being parallel to the one surface of the multiple substrate, a width of the bottom surface being greater than a thickness of the dicing blade. The cutting step includes cutting the mold resin with the dicing blade brought into contact with the bottom surface of the groove.

Thus, the bottom surface of the groove, which is parallel to the one surface of the multiple substrate, is wider than the thickness of the dicing blade; the mold resin is cut by the dicing blade that is in contact with the bottom surface of the groove. The bottom surface of the groove is therefore perpendicular to the direction of cutting. This enables to inhibit the dicing blade from meandering.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
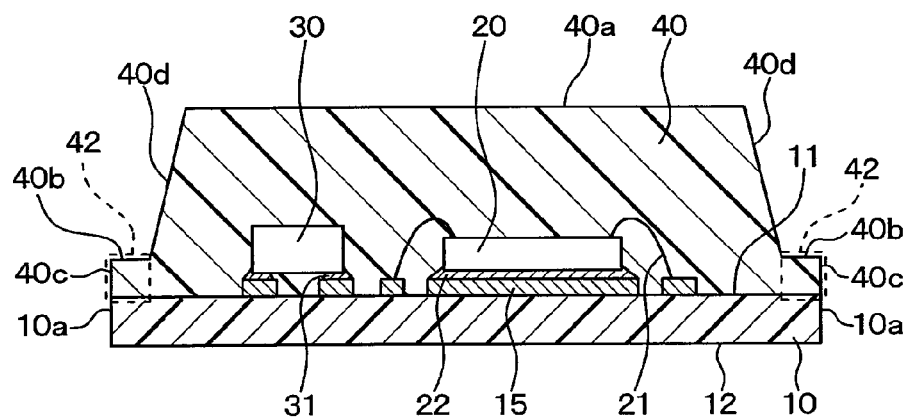
FIG. 1 is a cross-sectional view illustrating an electronic device according to a first embodiment of the present disclosure.

Embodiments of the present disclosure will now be described with reference to the accompanying drawings. In the following description of the embodiments, elements identical or equivalent to each other are designated by the same reference numerals.

First Embodiment

A first embodiment of the present disclosure will now be described with reference to the accompanying drawings. An electronic device according to the first embodiment is mounted in an automobile or other vehicle and preferably applied as a device that activates various devices of the vehicle.

Figure 2:
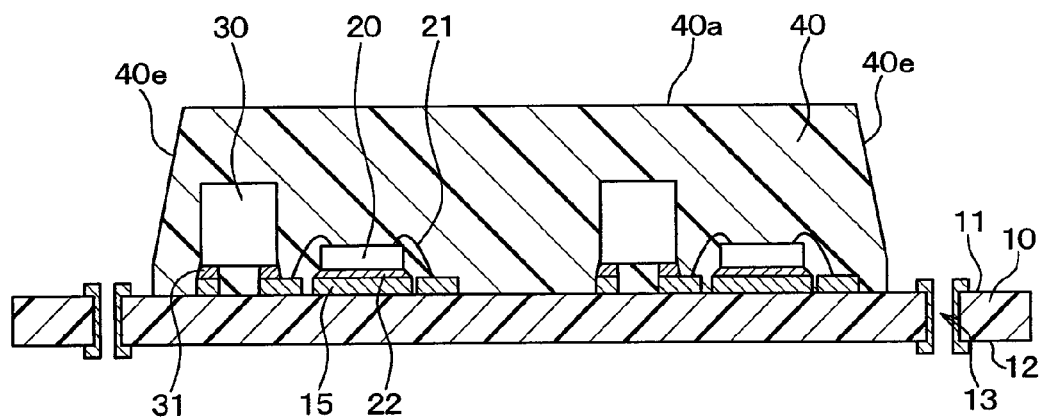
FIG. 2 is another cross-sectional view illustrating the electronic device according to the first embodiment of the present disclosure.
Figure 3:
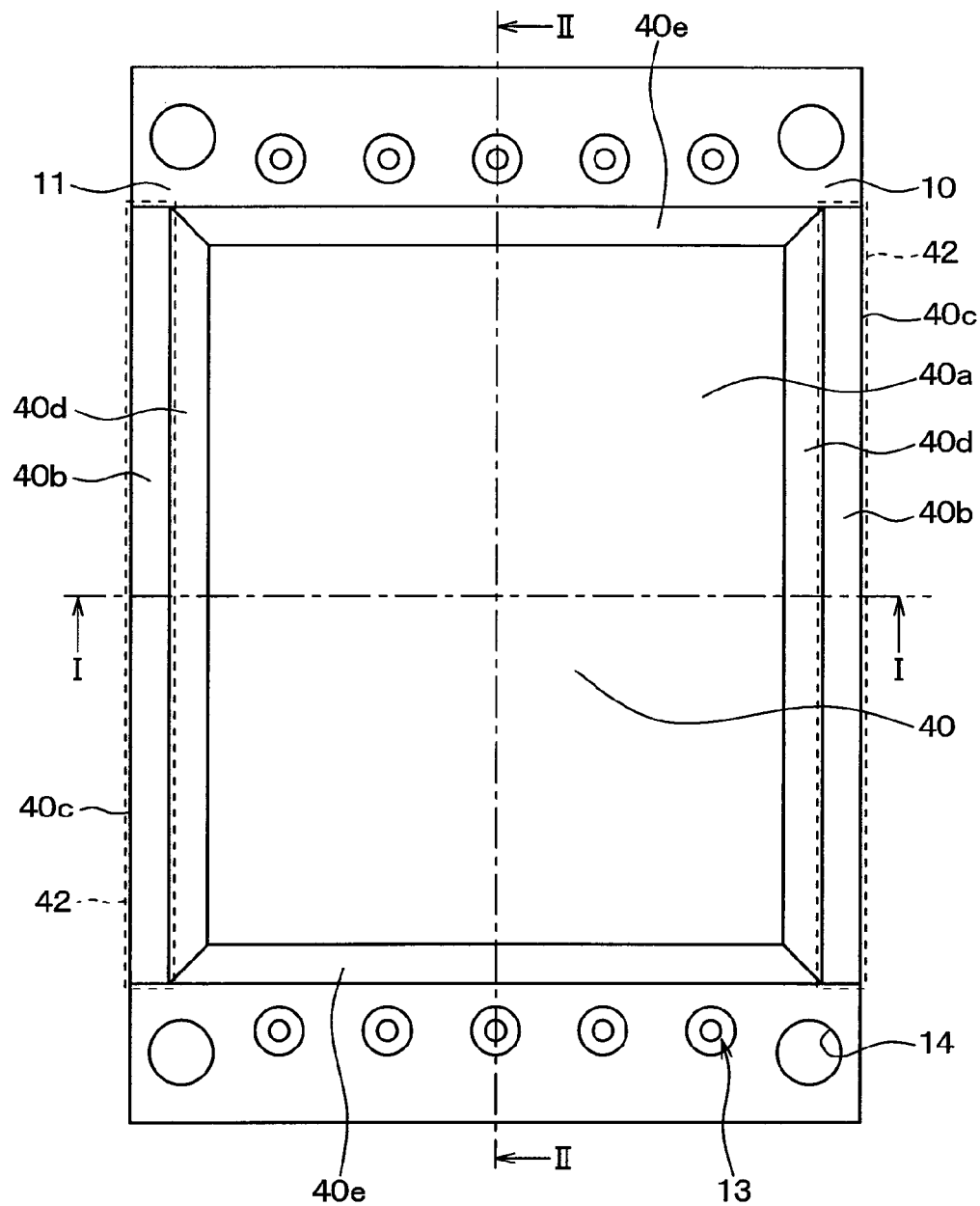
FIG. 3 is a plan view illustrating the electronic device according to the first embodiment of the present disclosure, which is depicted in FIGS. 1 and 2.

As in FIGS. 1 to 3, the electronic device includes a substrate 10, electronic parts 20, 30 to be mounted on the substrate 10, and mold resin 40 that seals the electronic parts 20, 30. FIG. 1 is a cross-sectional view taken along line I-I of FIG. 3. FIG. 2 is a cross-sectional view taken along line II-II of FIG. 3.

The substrate 10 is a plate-like member having one surface 11, which is also referred to as a first substrate face 11 or a front substrate face 11, and another surface 12, which is also referred to as a second substrate face 12 or a rear substrate face 12. The other surface 12 is opposite the one surface 11. Further, the substrate 10 has lateral surfaces 10a, which are also referred to as lateral substrate faces 12. The electronic parts 20, 30 are to be mounted on the one surface 11, and the mold resin 40 is to be disposed on the one surface 11. In the present embodiment, the plate-like member is rectangular in planar shape. The substrate 10, which is a wiring substrate based on epoxy resin or other resin, is formed of a penetration substrate or a build-up substrate, for instance.

Further, a wiring pattern (unshown) including an inner layer wiring or a surface layer wiring is formed on the substrate 10. The wiring pattern (surface layer wiring) is sealed with the mold resin 40 together with the electronic parts 20, 30, and extended to the outer side of the mold resin 40.

Moreover, through-holes 13 and retention holes 14 are formed in both longitudinal ends of the substrate 10 (i.e., both ends in a longitudinal direction that is an up-down direction as viewed in FIG. 3). The through-holes 13 plated with a metal or other material are connected to the wiring pattern. The retention holes 14 are used to secure the substrate 10 to a case or other mounted member.

The electronic parts 20, 30 using a surface mounting part or a through-hole mounting part are electrically connected to the wiring pattern when mounted on the substrate 10. The present embodiment exemplifies a semiconductor element 20 and a passive element 30 as the electronic parts 20, 30.

A microcomputer, a control element, or a power element such as an IGBT (Insulated Gate Bipolar Transistor) or a MOSFET (Metal-Oxide-Semiconductor Field-Effect Transistor) may be used as the semiconductor element 20. The semiconductor element 20 is connected to a land 15 of the substrate 10 with a bonding wire 21 and a die-bonding material 22 such as solder.

A chip resistor, a chip capacitor, a crystal oscillator may be used as the passive element 30. The passive element 30 is connected to the land 15 of the substrate 10 with a die-bonding material 31 such as solder.

The land 15 is connected to the wiring pattern or formed of a part of the wiring pattern. The electronic parts 20, 30 are therefore electrically connected to the wiring pattern formed on the substrate 10 and electrically connectable to an external circuit through a through-hole 13 connected to the wiring pattern.

The mold resin 40, which may use epoxy resin or other thermosetting resin, is formed by a transfer molding method or compression molding method that uses a mold. In the present embodiment, the mold resin 40 employs a half-mold structure, where the one surface 11 of the substrate 10 is sealed with the mold resin 40 while the other surface 12 of the substrate 10 is exposed without being sealed with the mold resin 40.

The mold resin 40 in the present embodiment will now be described in detail. As in FIGS. 1 to 3, the upper surface of the mold resin 40 that seals the electronic parts 20, 30 is rectangular in shape. The mold resin 40 is formed only in a region inside two opposing sides perpendicular to the longitudinal direction (up-down direction as viewed in FIG. 3) of the one surface 11 of the substrate 10, i.e., disposed so as to expose the two opposing sides. That is, the mold resin 40 is formed so as to expose, e.g., the through-holes 13 and the retention holes 14, which are formed in both ends in the longitudinal direction of the substrate 10.

The mold resin 40 is disposed over the one surface 11 of the substrate 10 except for both ends of two sides parallel to the longitudinal direction (two sides extended in the up-down direction as viewed in FIG. 3).

Further, the mold resin 40 has a first surface 40a and a second surface 40b. The first surface 40a is positioned over the electronic parts 20, 30. The second surface 40b is positioned toward sides parallel to the longitudinal direction (positioned outside the first surface 40a) of the one surface 11 of the substrate 10 as compared to the first surface 40a, and positioned over the sides parallel to the longitudinal direction. The first and second surfaces 40a, 40b are parallel to the one surface 11 of the substrate 10. The length of the second surface 40b in the longitudinal direction of the substrate 10 is greater than the length of the first surface 40a in the longitudinal direction of the substrate 10.

The mold resin 40 is such that the interval between the second surface 40b and the one surface 11 of the substrate 10 is shorter than the interval between the first surface 40a and the one surface 11 of the substrate 10. That is, a portion 42 of the mold resin 40 that is formed adjacent to the sides parallel to the longitudinal direction of the one surface 11 of the substrate 10 is thinner than a portion of the mold resin 40 that covers the electronic parts 20, 30. In the present embodiment, the portion formed adjacent to the sides parallel to the longitudinal direction of the one surface 11 of the substrate 10 is 0.5 to 1.5 mm in thickness. The portion 42 of the mold resin 40 may be also referred to as a thin portion of the mold resin 40; the portion of the mold resin 40 that covers or seals the electronic parts 20, 30 may be also referred to as a sealing portion of the mold resin 40.

A portion (surface) of the mold resin 40 that is positioned over the sides parallel to the longitudinal direction of the one surface 11 of the substrate 10 is a third surface 40c. The third surface 40c is in the same plane as, i.e., flush with, lateral surfaces 10a of the substrate 10 that have the sides parallel to the longitudinal direction of the one surface 11 of the substrate 10. The lateral surfaces 10a of the substrate 10 and the third surface 40c of the mold resin 40 are cut surfaces (cut resin surfaces) formed in a later-described cutting process. The electronic device according to the present embodiment has two lateral surfaces 10a and two third surfaces 40c. It is noted that the third surface 40c of the mold resin 40, which is flush with the cut surface or cut resin surface, may be also referred to as a flush surface of the mold resin 40; the second surface 40b of the mold resin 40, which is parallel to the one surface 11 of the substrate 10 and joined with the third surface 40c to be described below, may be also referred to as a parallel surface of the mold resin 40.

Further, the mold resin 40 has a fourth surface 40d and a fifth surface 40e. The fourth surface 40d joins the first surface 40a to the second surface 40b. The fifth surface 40e joins the first surface 40a to the one surface 11 of the substrate 10. In the present embodiment, the fourth surface 40d is a tapered surface that is tilted from the normal line to the one surface 11 of the substrate 10. A portion of the fifth surface 40e that is positioned toward the first surface 40a is a tapered surface that is tilted from the normal line to the one surface 11 of the substrate 10, and a portion of the fifth surface 40e that is positioned toward the one surface 11 of the substrate 10 is a surface parallel to the normal line to the one surface 11 of the substrate 10. The portion of the fifth surface 40e that is positioned toward the one surface 11 of the substrate 10 is formed as a surface parallel to the normal line to the one surface 11 of the substrate 10 for facilitating observation of whether the mold resin 40 is separated.

The structure of the electronic device according to the present embodiment has been described above. A method for manufacturing the electronic device will now be described with reference to FIG. 4.

Figure 4:
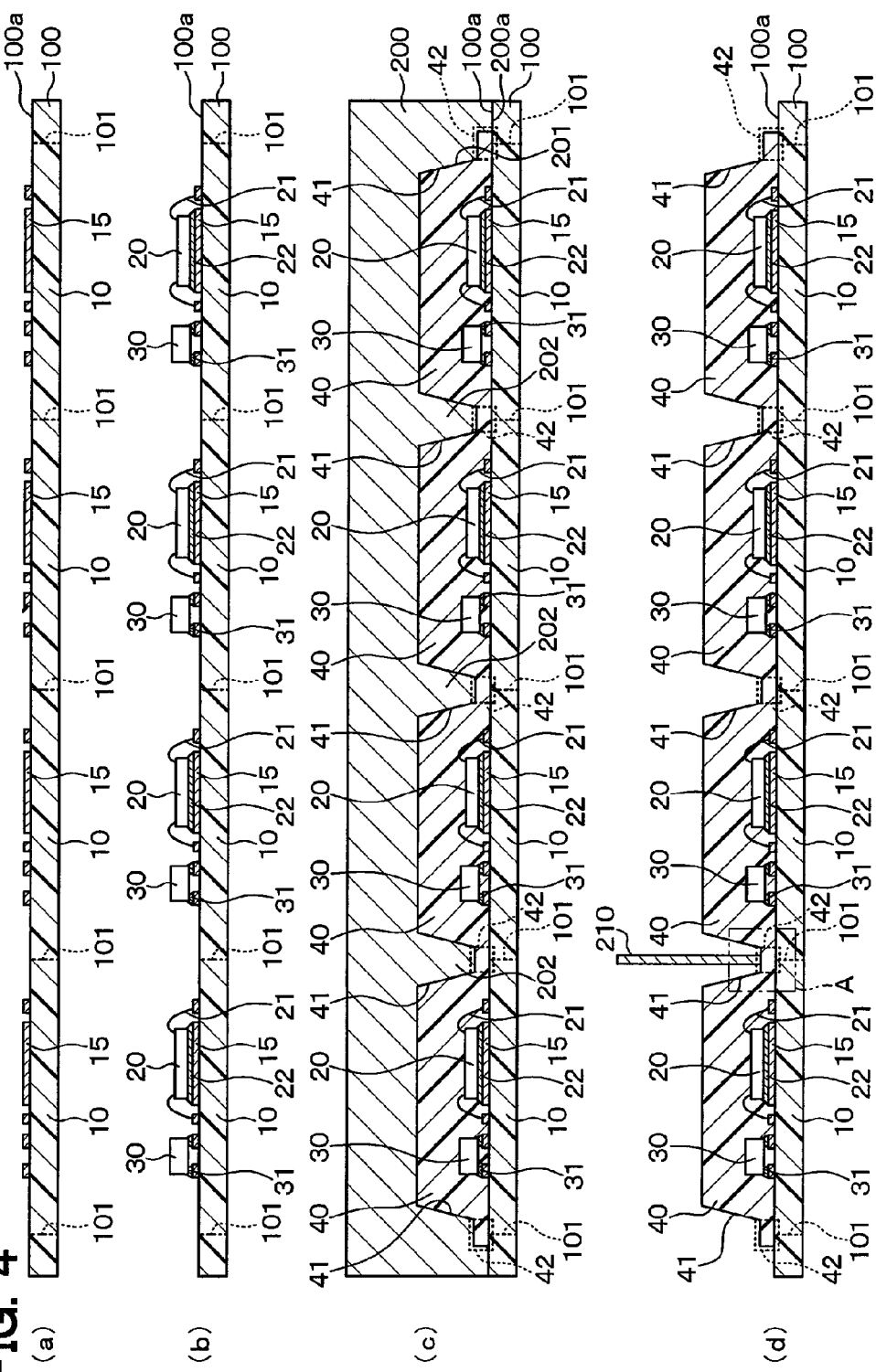
FIG. 4 is a cross-sectional view illustrating a process that manufactures the electronic device depicted in FIG. 1.

A multiple substrate 100 is prepared by integrally coupling a plurality of substrates in a planar manner and is zoned with dicing lines 101, as in (a) of FIG. 4.

The multiple substrate 100 in the present embodiment includes four substrates 10. For example, the through-holes 13 and the retention holes 14, which are positioned in a cross-section other than depicted in (a) of FIG. 4, are formed in a portion of each substrate 10 that is not sealed with the mold resin 40. FIG. 4 is prepared so that the longitudinal direction of each substrate 10 is the direction of depth as viewed in FIG. 4.

Over one surface 100a of the multiple substrate 100, the electronic parts 20, 30 are mounted on the land 15 of each substrate 10 to electrically connect to the land 15 as appropriate, as in (b) of FIG. 4.

Figure 5:
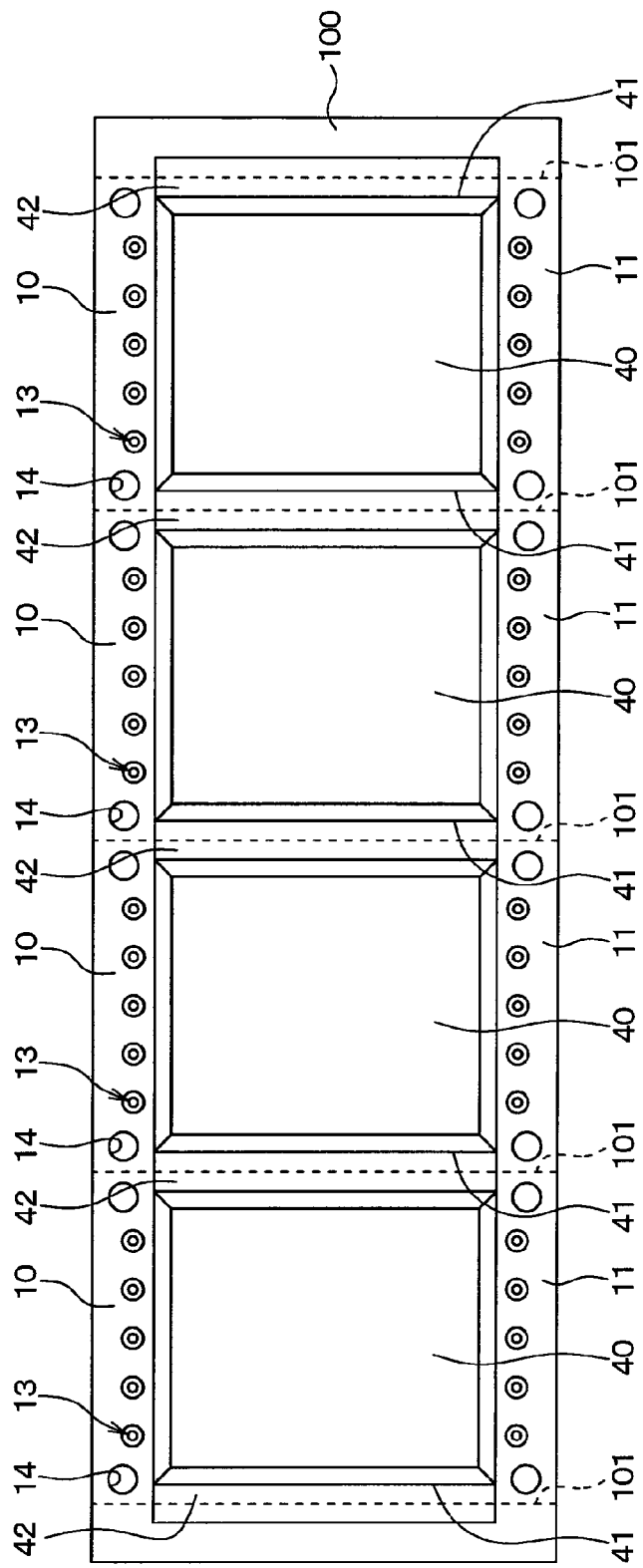
FIG. 5 is a plan view of (c) of FIG. 4.

As in (c) of FIG. 4 and FIG. 5, the mold resin 40 is formed, for example, by a transfer molding or compression molding method that uses a mold 200, so as to seal the electronic parts 20, 30 and the one surface 100a of the multiple substrate 100. The mold 200 is omitted from FIG. 5.

The mold 200 is prepared so that a concave 201 forming the outline of the mold resin 40 is formed on one surface 200a while a protrusion 202 is formed on a portion opposing the dicing lines 101 on the multiple substrate 100. The electronic parts 20, 30 are then disposed in the concave 201, and the mold resin 40 is formed with the one surface 200a brought into contact with the outer rim of the multiple substrate 10 so that the bottom surface of the concave 201 is parallel to the one surface 100a of the multiple substrate 100.

The mold resin 40 is also formed over the dicing lines 101, and portions formed over the individual substrates 10 are joined and integrated by portions formed over the dicing lines 101. Further, the protruding leading end surface of the protrusion 202 (hereinafter simply referred to as the leading end surface) is parallel to the bottom surface of the concave 201, and the width of the leading end surface (the length in the left-right direction as viewed in (c) of FIG. 4) is greater than the width of the dicing lines 101 and the thickness of a later-described dicing blade 210.

The mold resin 40 is thus formed so as to include a groove 41, which is configured by the protrusion 202 in a portion positioned over the dicing lines 101 and a portion of each substrate 10 that is in contact with the dicing lines 101. The portion positioned over the dicing lines 101 and the portion of each substrate 10 that is in contact with the dicing lines 101 are thinner than a portion of the mold resin 40 that seals the electronic parts 20, 30. Further, the bottom surface of the groove 41 is parallel to the one surface 100a of the multiple substrate 100 and wider than the thickness of the later-described dicing blade 210.

The interval between the leading end surface of the protrusion 202 and the one surface 100a of the multiple substrate 100 is preferably 0.5 to 1.5 mm. That is, the mold resin 40 positioned over the dicing lines 101 or over a portion of each substrate 10 that is in contact with the dicing lines 101 is preferably 0.5 to 1.5 mm in thickness.

One reason is that, if the interval between the leading end surface of the protrusion 202 and the one surface 100a of the multiple substrate 100 is shorter than 0.5 mm, the flow of resin between the leading end surface of the protrusion 202 and the one surface 100a of the multiple substrate 100 may be obstructed to generate voids in the mold resin 40, for example.

Another reason is that, if the interval between the leading end surface of the protrusion 202 and the one surface 100a of the multiple substrate 100 is longer than 1.5 mm, the dicing blade 210 may meander when a later-described process depicted in (d) of FIG. 4 is performed to cut the dicing lines 101 at an end of the multiple substrate 100.

The dicing lines 101 at an end of the multiple substrate 100 are dicing lines 101 that are not positioned between neighboring substrates 10, namely, two out of five dicing lines 101 in FIG. 4 that are positioned at both ends. The reason why the dicing blade 210 meanders when the dicing lines 101 are cut while the thickness of the mold resin 40 is greater than 1.5 mm is that a considerable variation is experienced when the dicing lines 101 are cut at a position toward a substrate 10 and at a position toward the opposite end.

Figure 6:
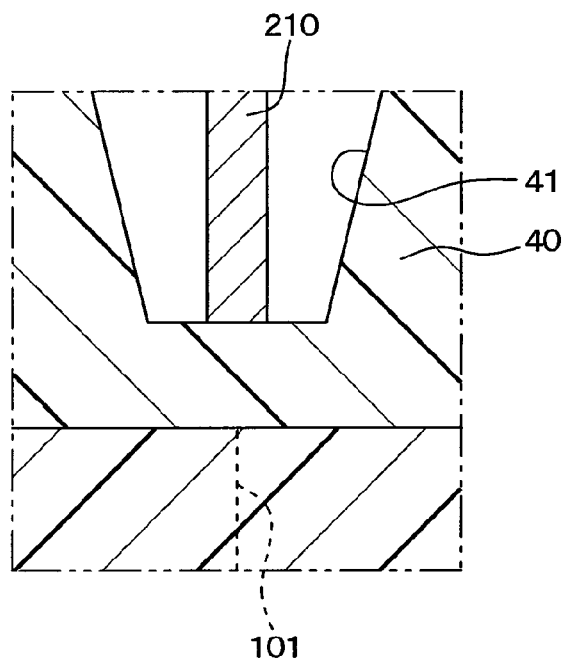
FIG. 6 is an enlarged view of region A, which is depicted in FIG. 4.

Subsequently, the multiple substrate 100 is divided into the individual substrates 10 by cutting the multiple substrate 100 along the dicing lines 101 while the dicing blade 210 is brought into contact with only the bottom surface of the groove 41 and kept away from lateral surfaces, as in (d) of FIG. 4 and FIG. 6. The electronic device is manufactured as described.

In the above, the bottom surface of the groove 41 is parallel to the one surface 100a of the multiple substrate 100. The cutting direction of the dicing blade 210 is thus perpendicular to the surface with which the dicing blade 210 is brought into contact. This enables to inhibit the dicing blade 210 from meandering.

The bottom surface of the groove 41 is formed over the dicing lines 101 and over a portion of each substrate 10 that is brought into contact with the dicing lines 101. The second surface 40b of the aforementioned mold resin 40 is therefore configured by the bottom surface of the groove 41 that remains after the multiple substrate 10 is cut.

As described, in the present embodiment, the mold resin 40 having the groove 41 configured by the protrusion 202 is formed on a portion positioned over the dicing lines 101 and on a portion of each substrate 10 that is in contact with the dicing lines 101. The mold resin 40 is configured so that the portion positioned over the dicing lines 101 and the portion of each substrate 10 that is in contact with the dicing lines 101 are thinner than a portion that seals the electronic parts 20, 30. The bottom surface of the groove 41 is parallel to the one surface 100a of the multiple substrate 100 and longer than the thickness of the later-described dicing blade 210. When the dicing blade 210 cuts the mold resin 40, the dicing blade 210 is brought into contact with the bottom surface of the groove 41.

The cutting direction is thereby perpendicular to the mold resin 40 with which the dicing blade 210 comes into contact. This enables to inhibit the dicing blade 210 from meandering.

Further, a portion of the mold resin 40 that configures the third surface 40c is thinner than a portion of the mold resin 40 that configures the electronic parts 20, 30. This can reduce stress generated between a substrate 10 and the portion of the mold resin 40 that configures the third surface 40c, in contrast to a case where the thickness of the portion of the mold resin 40 that seals the electronic parts 20, 30 is fixed. This enables to inhibit the separation of the mold resin 40.

Second Embodiment

A second embodiment of the present disclosure will now be described. The second embodiment is obtained by changing the shape of the second surface 40b in the first embodiment. The second embodiment is the same as the first embodiment in the other respects, which will not be described here.

Figure 7:
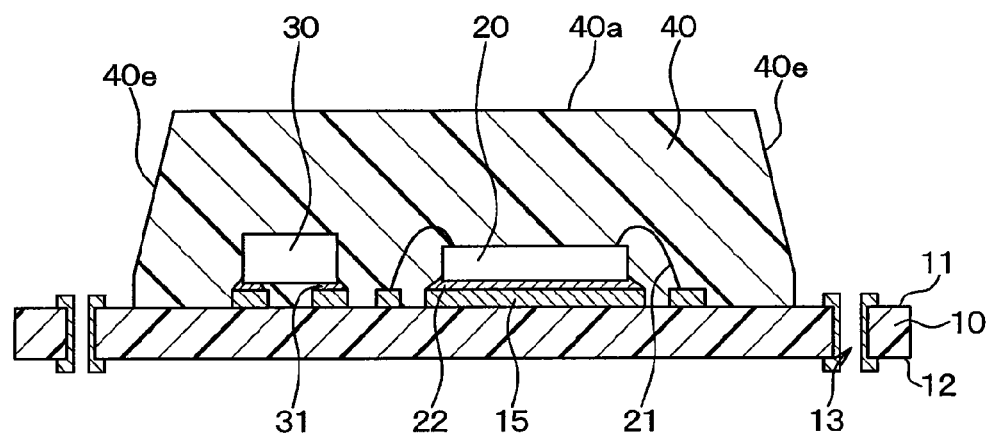
FIG. 7 is a cross-sectional view illustrating the electronic device according to a second embodiment of the present disclosure.
Figure 8:
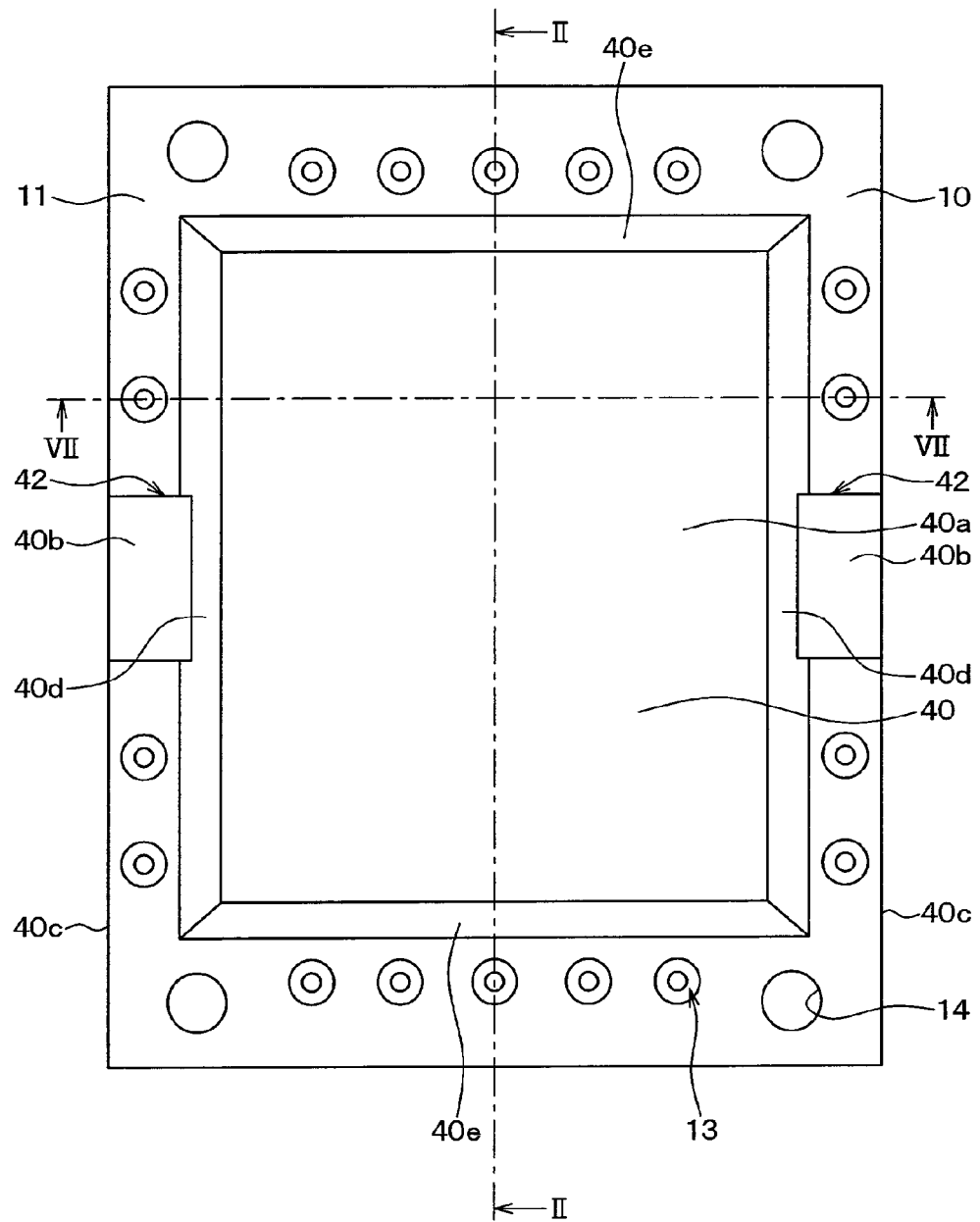
FIG. 8 is a plan view of the electronic device depicted in FIG. 7.

As in FIGS. 2, 7, and 8, the electronic device according to the second embodiment provides a portion of the mold resin 40 configuring the second surface 40b only in a region near the center between two sides parallel to the longitudinal direction of the one surface 11 of a substrate 10 (the two sides extended in the up-down direction as viewed in FIG. 8), out of the region adjacent to the two sides. That is, the length of the second surface 40b in the longitudinal direction of the substrate 10 is less than the length of the first surface 40a in the longitudinal direction of the substrate 10. The region adjacent to the two sides other than the region near the center between the two sides within the substrate 10 is exposed from the mold resin 40.

FIG. 7 is a cross-sectional view taken along line VII-VII of FIG. 8. In the present embodiment, the length of the second surface 40b in the longitudinal direction of the substrate 10 is assumed to be, but not particularly limited to, ⅕ to ⅔ the length of the substrate 10 in the longitudinal direction.

The through-holes 13 and the surface layer wiring are formed in a portion of a region that is adjacent to the two sides parallel to the longitudinal direction of the substrate 10 and exposed from the mold resin 40.

Figure 9:
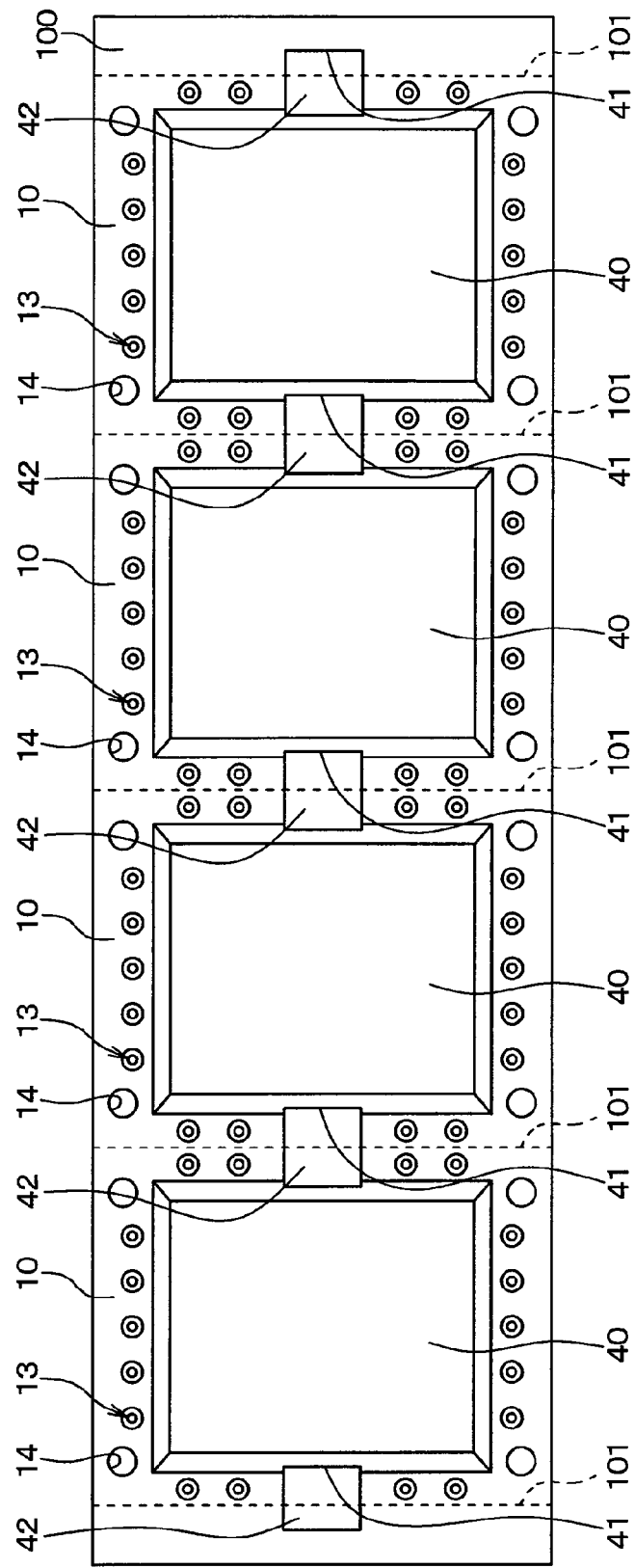
FIG. 9 is a plan view illustrating a process depicted in (c) of FIG. 4 in accordance with the second embodiment of the present disclosure.

As in FIG. 9, the electronic device described above is manufactured by forming the mold resin 40 such that portions of the mold resin 40 formed over the individual substrates 10 are joined with each other only above the center of the dicing lines 101 in a molding process depicted in (c) of FIG. 4.

The length of a portion of the substrates 10 in the longitudinal direction that joins the portions of the mold resin 40 formed over the individual substrates 10 (the length of a portion of the mold resin 40 that is positioned over the dicing lines 101) is preferably ⅕ to ⅔ the length of the substrates 10 in the longitudinal direction.

One reason is that, if the length of the portion of the substrates 10 in the longitudinal direction that joins the portions of the mold resin 40 formed over the individual substrates 10 is less than ⅕ the length of the substrates 10 in the longitudinal direction, the flow of resin between the leading end surface of the protrusion 202 and the one surface 100a of the multiple substrate 100 may be obstructed to generate voids in the mold resin 40, for example. Another reason is that, if the length of the portion of the substrates 10 in the longitudinal direction that joins the portions of the mold resin 40 formed over the individual substrates 10 is greater than ⅔ the length of the substrates 10 in the longitudinal direction, a portion of a region adjacent to the two sides parallel to the longitudinal direction of the substrates 10 that is exposed from the mold resin 40 is reduced to pose a difficulty in obtaining an adequate space for forming the through-holes 13, for example.

As described, the present embodiment reduces the amount of mold resin 40 that is positioned over the dicing lines 101. The total amount of mold resin 40 can be decreased to achieve cost reduction. Further, the through-holes 13 can be formed in a portion of a substrate 10 that is unsealed with the mold resin 40 adjacent to the two sides parallel to the longitudinal direction. The area of the substrate 10 can thus be effectively used. Moreover, the portion of the substrate 10 that is unsealed with the mold resin 40 adjacent to the two sides parallel to the longitudinal direction can be used as an air vent (air-bleeding portion). This enables to inhibit the generation of voids in the mold resin 40.

Modification of Second Embodiment

Figure 10:
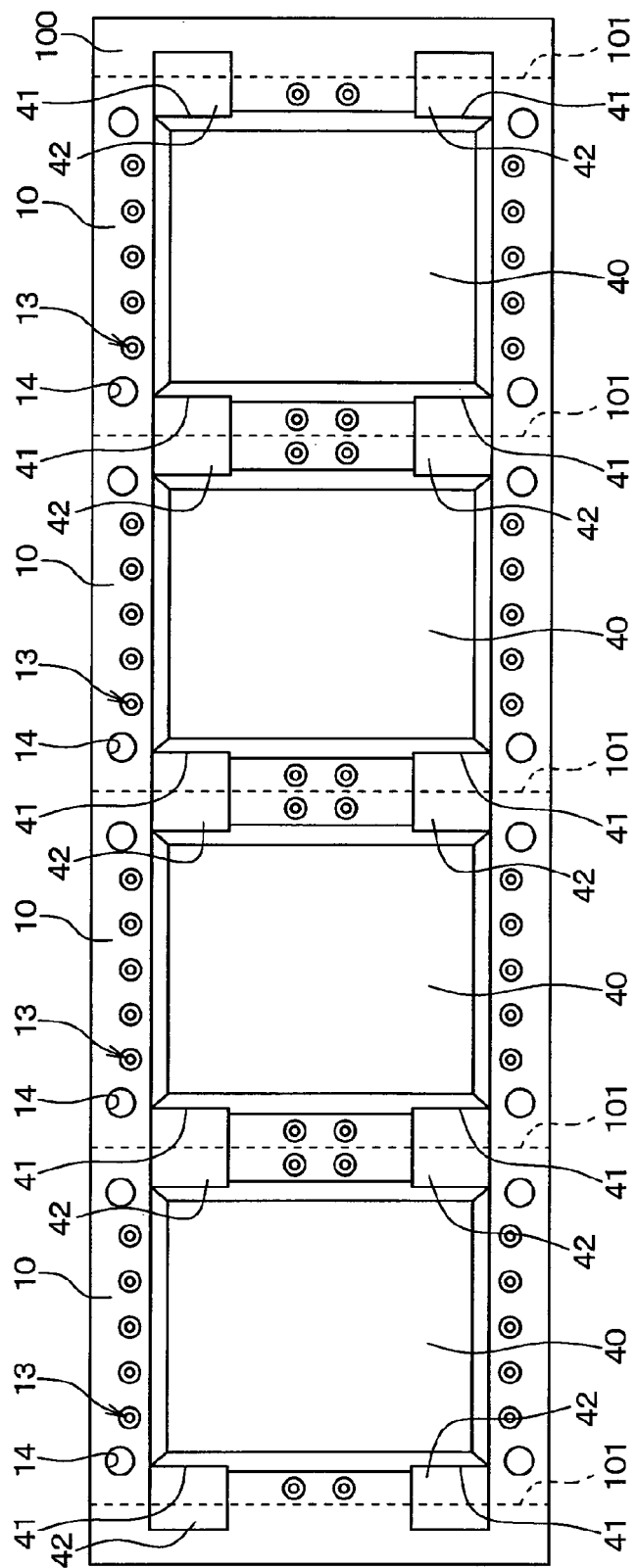
FIG. 10 is a plan view illustrating the process depicted in (c) of FIG. 4 in accordance with a modification of the second embodiment of the present disclosure.

The second embodiment has been described with reference to a case where the mold resin 40 is formed such that portions of the mold resin 40 are joined to each other only above the center of the dicing lines 101. However, the portions of the mold resin 40 may be joined to each substrate 10 on both end sides of the dicing lines 101 as in FIG. 10 without joining the portions of the mold resin 40 over the respective substrates 10 to each other above the center of the dicing lines 101.

Third Embodiment

A third embodiment of the present disclosure will now be described with reference to FIGS. 2 and 12 to 16. The third embodiment is obtained by changing the first embodiment in such a manner as to change the configuration of a portion of the mold resin 40 that is thinner than a portion of the mold resin 40 that covers the electronic parts 20, 30. The thinner portion is hereinafter referred to as the thin portion 42. More specifically, the thin portion 42 is a portion of the mold resin 40 described in conjunction with the first embodiment that covers the electronic parts 20, 30, that is, a portion formed adjacent to a side parallel to the longitudinal direction of the one surface 11 of the substrate 10. In the other respects, the third embodiment is basically the same as the first embodiment. The following therefore describes only differences from the first embodiment.

Figure 12:
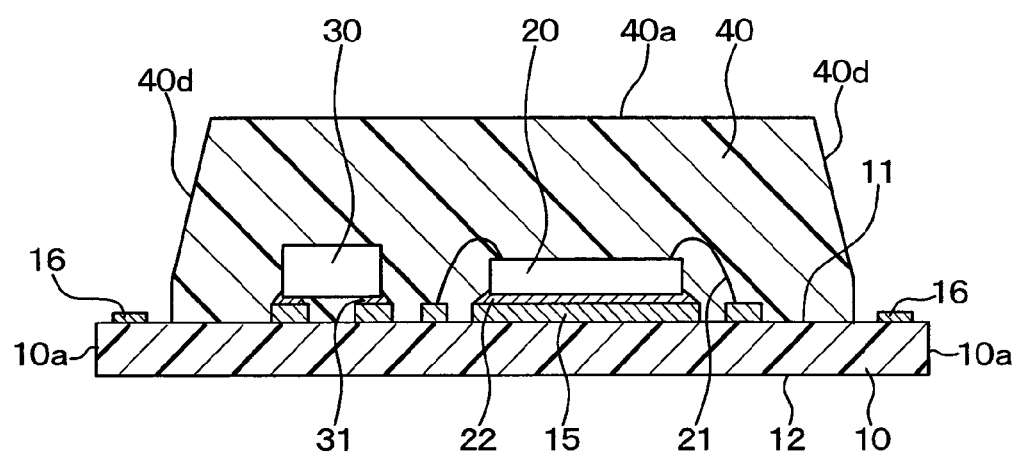
FIG. 12 is a cross-sectional view illustrating the electronic device according to a third embodiment of the present disclosure.
Figure 13:
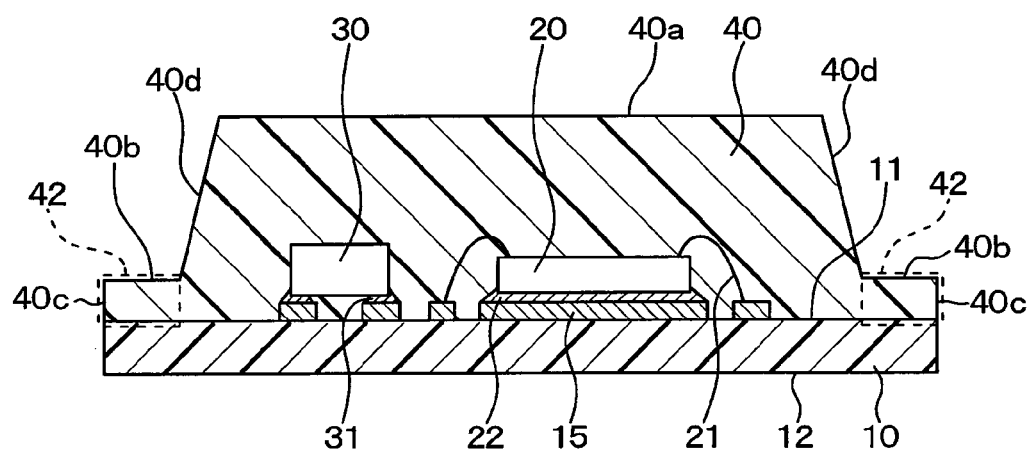
FIG. 13 is a cross-sectional view illustrating the electronic device according to the third embodiment of the present disclosure and different from the cross-sectional views in FIGS. 12 and 15.
Figure 15:
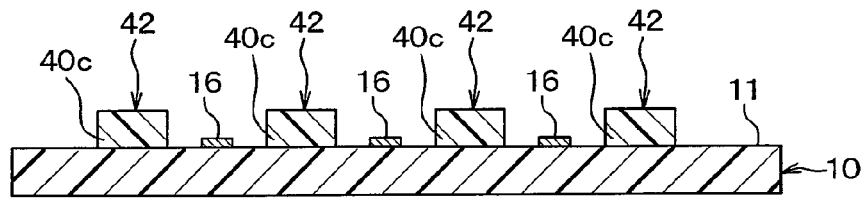
FIG. 15 is a cross-sectional view illustrating the electronic device according to the third embodiment of the present disclosure and different from the cross-sectional views in FIGS. 12 and 13.

As indicated in FIG. 2, the electronic device according to the third embodiment has the same cross-section as the electronic device according to the first embodiment in a situation where the cross-section is different from those depicted in FIGS. 12, 13, and 15.

In the first embodiment, as in FIGS. 1 and 3, the thin portion 42 is extended from the fourth surface 40d to an end of the one surface 11 of the substrate 10 within the whole range where the fourth surface 40d is positioned in the longitudinal direction of the one surface 11 of the substrate 10, as viewed in the direction of the normal line to the one surface 11 of a substrate 10. In the third embodiment, however, the thin portion 42 is extended from the fourth surface 40d to the end of the one surface 11 of the substrate 10 within only a part of the whole range where the fourth surface 40d is positioned in the longitudinal direction of the one surface 11 of the substrate 10, as in FIGS. 12 to 15. More specifically, in the present embodiment, a portion where the thin portion 42 is extended from the fourth surface 40d to the end of the one surface 11 of the substrate 10 and a portion where no thin portion 42 is extended from the fourth surface 40d are alternately disposed in the longitudinal direction of the one surface 11 of the substrate 10. The electronic device according to the present embodiment therefore includes a portion 5 within which a sealed region where the thin portion 42 is formed and an exposed region where no thin portion 42 is formed are alternately disposed in the direction of a boundary line between the one surface 11 of the substrate 10 and the cut surface (the third surface 40c) of the mold resin 40. This portion 5 is hereinafter referred to as the alternately disposed portion 5. The sealed region is a region where the one surface 11 of the substrate 10 is sealed with the thin portion 42 as viewed in the direction of the normal line to the one surface 11 of the substrate 10. The exposed region is a region where the one surface 11 of the substrate 10 is outwardly exposed without being sealed with the thin portion 42 as viewed in the direction of the normal line to the one surface 11 of the substrate 10.

Further, one electrode (hereinafter referred to as the first electrode) 16 is disposed in each of a plurality of exposed regions disposed on the one surface 11 of the substrate 10 as in FIG. 14. The first electrodes 16 are configured as electrodes that differ from each other in potential. The present embodiment thus disposes the first electrodes 16 mutually differing in potential on the one surface 11 of the substrate 10 within the mutually-different exposed regions of the alternately disposed portion 5. The first electrodes 16 are electrically connected to the electronic parts 20, 30, for example, through a wiring pattern (unshown) on the substrate 10 and electrically connected to an external device such as a motor through a wiring (unshown).

The mold resin 40 positioned in the sealed region between two first electrodes 16 that are disposed in different exposed regions and different in potential is thicker than the two first electrodes 16. For example, this mold resin 40 is 0.5 to 1.5 mm in thickness; the two first electrodes 16 are 0.1 to 1.0 mm in thickness.

Figure 16:
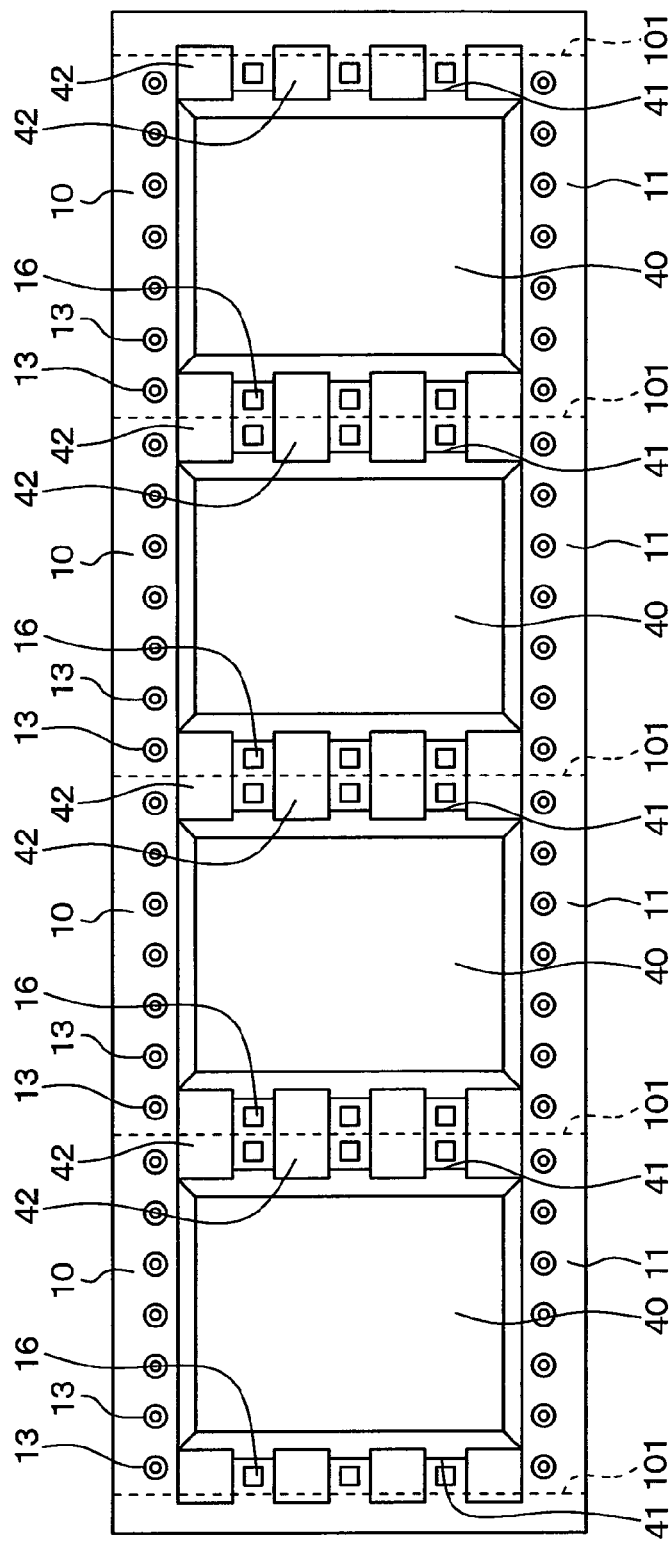
FIG. 16 is a plan view of a workpiece in a molding process depicted in (c) of FIG. 4 that is performed for the electronic device according to the third embodiment of the present disclosure.

As in FIG. 16, the electronic device is such that the mold resins 40 formed over the individual substrates 10 are intermittently joined over the dicing lines 101 in the longitudinal direction of the one surface 11 of a substrate 10 in the molding process depicted in (c) of FIG. 4.

As described, the electronic device includes the alternately disposed portion 5 that contains (i) the sealed region forming the thin portion 42 and (ii) the exposed region forming no thin portion 42 to be alternately disposed in the direction of the boundary line between the one surface 11 of the substrate 10 and the cut surface (the third surface 40c). Further, the first electrodes 16 are disposed on the one surface 11 of the substrate 10 so that the first electrodes 16, which differ in potential, are disposed in different exposed regions.

As the first electrodes 16 are disposed on a portion of the one surface 11 of the substrate 10 that is without the thin portion 42, the electronic device permits the first electrodes 16 to be disposed without increasing the area of the one surface 11 of the substrate 10. The size of the electronic device can be reduced. Further, the electronic device has the sealed regions including at least three sides of the periphery of each first electrode 16 (three sides being (i) two sealed regions of the mold region 40 neighboring the exposed regions disposing the first electrodes 16 and (ii) the portion of the mold region 40 sealing the electronic parts 20, 30). The sealed regions permit the substrates 10 to join the mold resins 40. The above-mentioned periphery of the electronic device therefore has higher strength than when the above-mentioned periphery is left unsealed and exposed to the outside. The electronic device thus excels in vibration resistance. Besides, the mold resin 40 is disposed between two first electrodes 16 that are disposed in different exposed regions of the one surface 11 of the substrate 10 and different in potential. This increases the creepage distance between the two first electrodes 16. The electronic device provides improved insulation properties and reduces the possibility of a leakage current flowing.

Moreover, the electronic device is configured so that the mold resin 40 positioned in the sealed region between the first electrodes 16 that are disposed in different exposed regions and different in potential is thicker than the first electrodes 16 differing in potential.

The electronic device thus provides an increased spatial distance between two first electrodes 16 that are disposed in different exposed regions and different in potential. As described, the electronic device is configured so as to increase not only the creepage distance but also the spatial distance. The electronic device therefore particularly provides improved insulation properties and reduces the possibility of a leakage current flowing.

Modification of Third Embodiment

Figure 17:
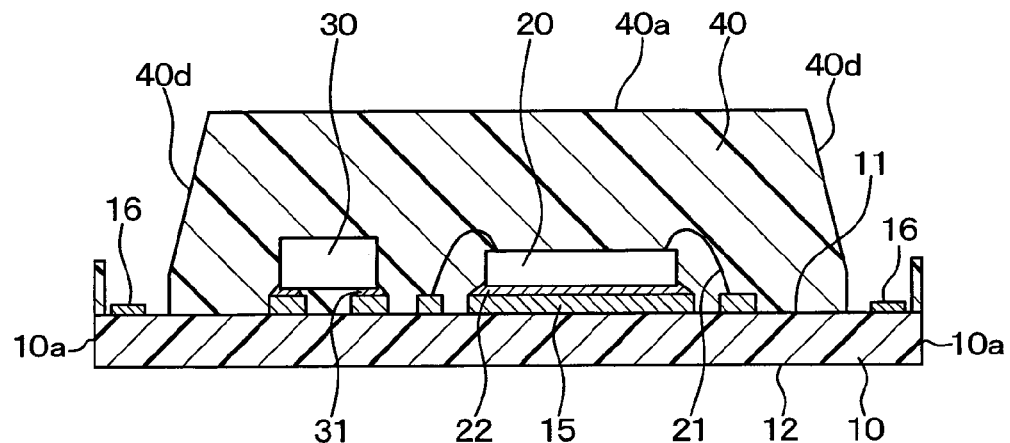
FIG. 17 is a cross-sectional view illustrating the electronic device according to a modification of the third embodiment of the present disclosure.
Figure 18:
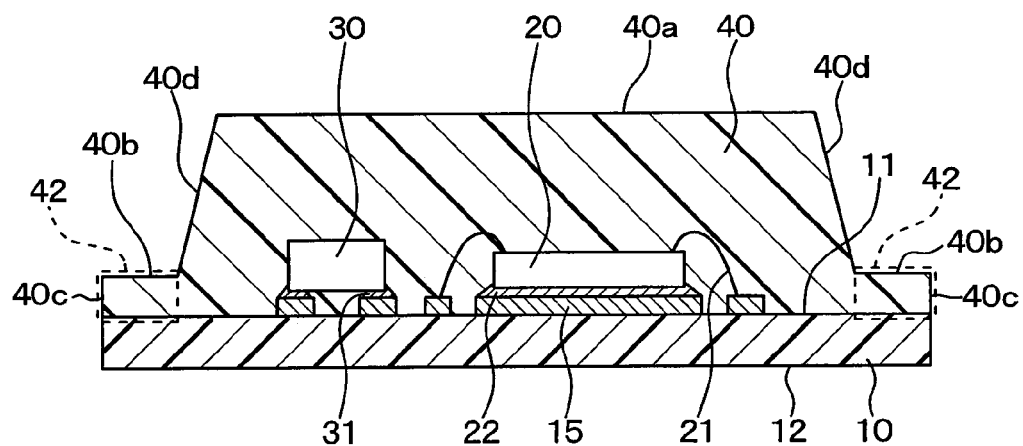
FIG. 18 is a cross-sectional view illustrating the electronic device according to the modification of the third embodiment of the present disclosure and different from the cross-sectional view in FIG. 17.
Figure 19:
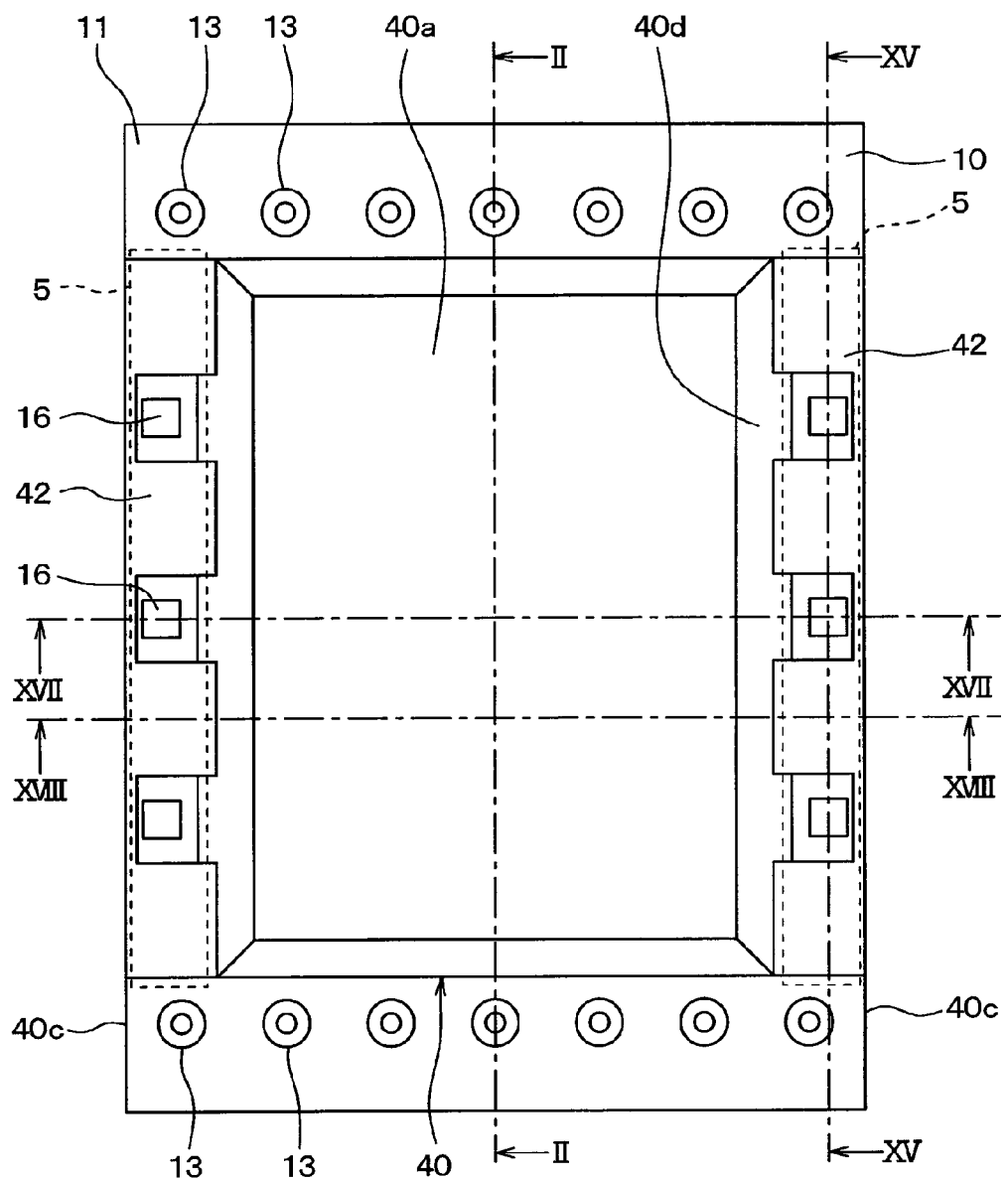
FIG. 19 is a plan view of the electronic device depicted in FIGS. 17 and 18.

The third embodiment has been described with reference to a case disposing alternatively (i) a portion extending the thin portion 42 from the fourth surface 40d to the end of the one surface 11 of the substrate 10 and (ii) a portion extending no thin portion 42 from the fourth surface 40d, in the longitudinal direction of the one surface 11 of the substrate 10. However, as in FIGS. 17 to 19, the sealed region may be positioned opposite a portion sealing the electronic parts 20, 30 to thereby adjacently interpose an exposed region in the portion extending no thin portion 42 from the fourth surface 40d as described in conjunction with the third embodiment. Further, the first electrodes 16 may be surrounded by a portion of the mold resin 40 that is positioned in a sealed region of the alternately disposed portion 5, a portion of the mold resin 40 that seals the electronic parts 20, 30, and a portion of the mold resin 40 that is positioned in a sealed region opposite the portion that seals the electronic parts 20, 30. Here, the periphery of each of the first electrodes 16 has increased strength. The electronic device thus has improved vibration resistance.

Figure 20:
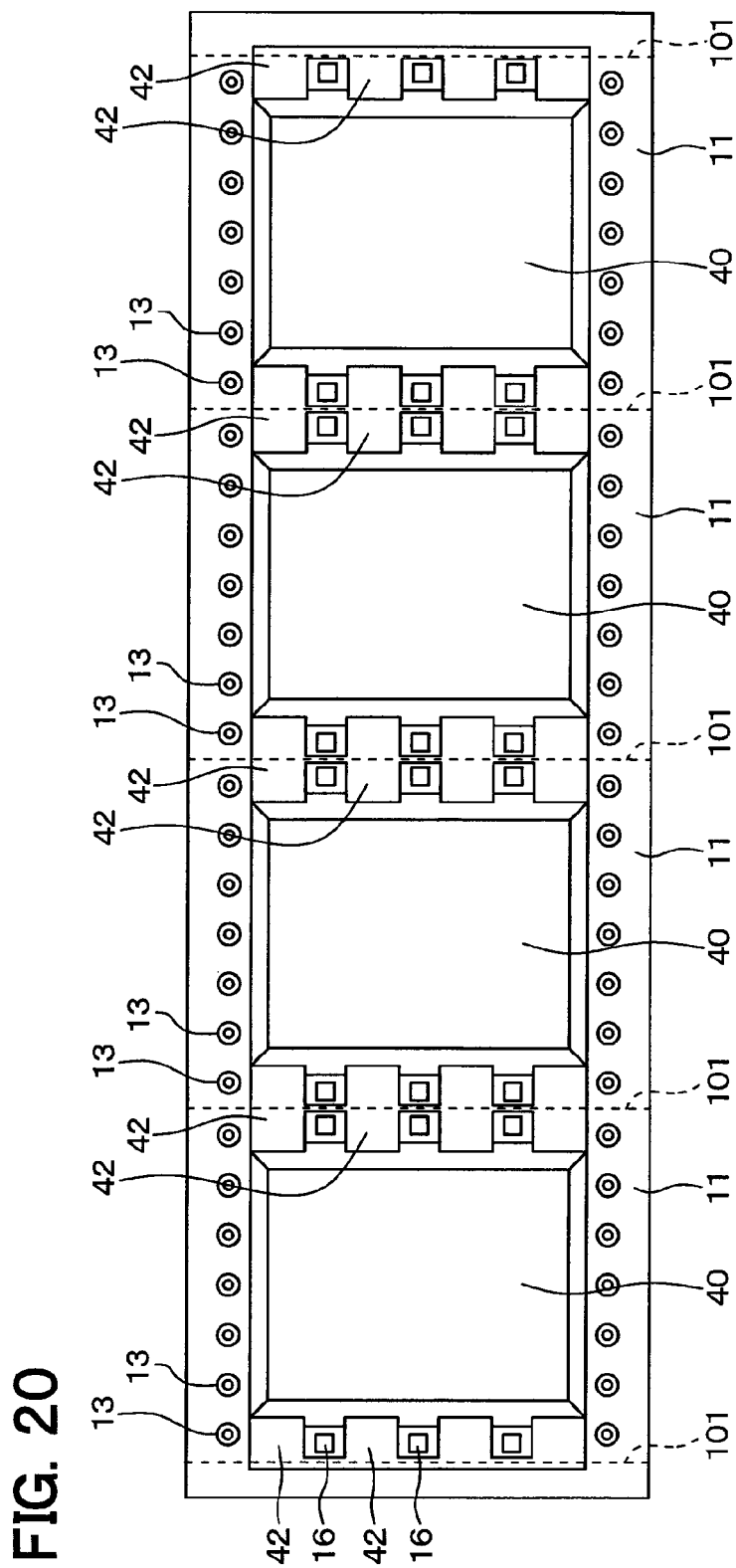
FIG. 20 is a plan view of a workpiece in the molding process depicted in (c) of FIG. 4 that is performed for the electronic device according to the modification of the third embodiment of the present disclosure.

As in FIG. 20, the above-described electronic device can be manufactured by forming the mold resin 40 in the molding process depicted in (c) of FIG. 4 in such a manner that the thin portion 42 is extended along the dicing lines 101.

Fourth Embodiment

A fourth embodiment of the present disclosure will now be described with reference to FIGS. 2, 12, and 21 to 23. The fourth embodiment is obtained by changing the shape of the thin portion 42 in the third embodiment. In the other respects, the fourth embodiment is basically the same as the third embodiment. The following therefore describes only differences from the third embodiment.

Figure 21:
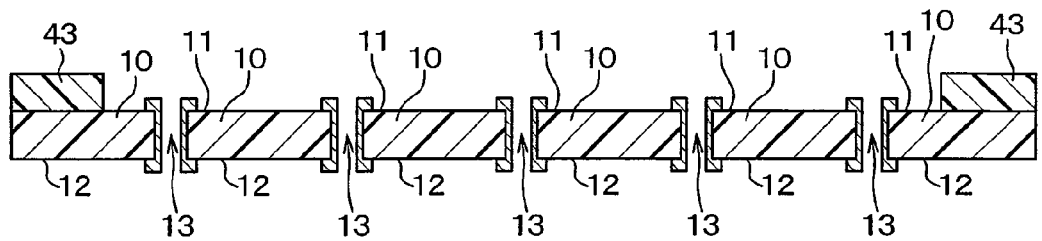
FIG. 21 is a cross-sectional view illustrating the electronic device according to a fourth embodiment of the present disclosure.

As indicated in FIGS. 2 and 12, the electronic device according to the fourth embodiment has the same cross-section as the electronic device according to the third embodiment except for the cross-section depicted in FIG. 21.

Figure 22:
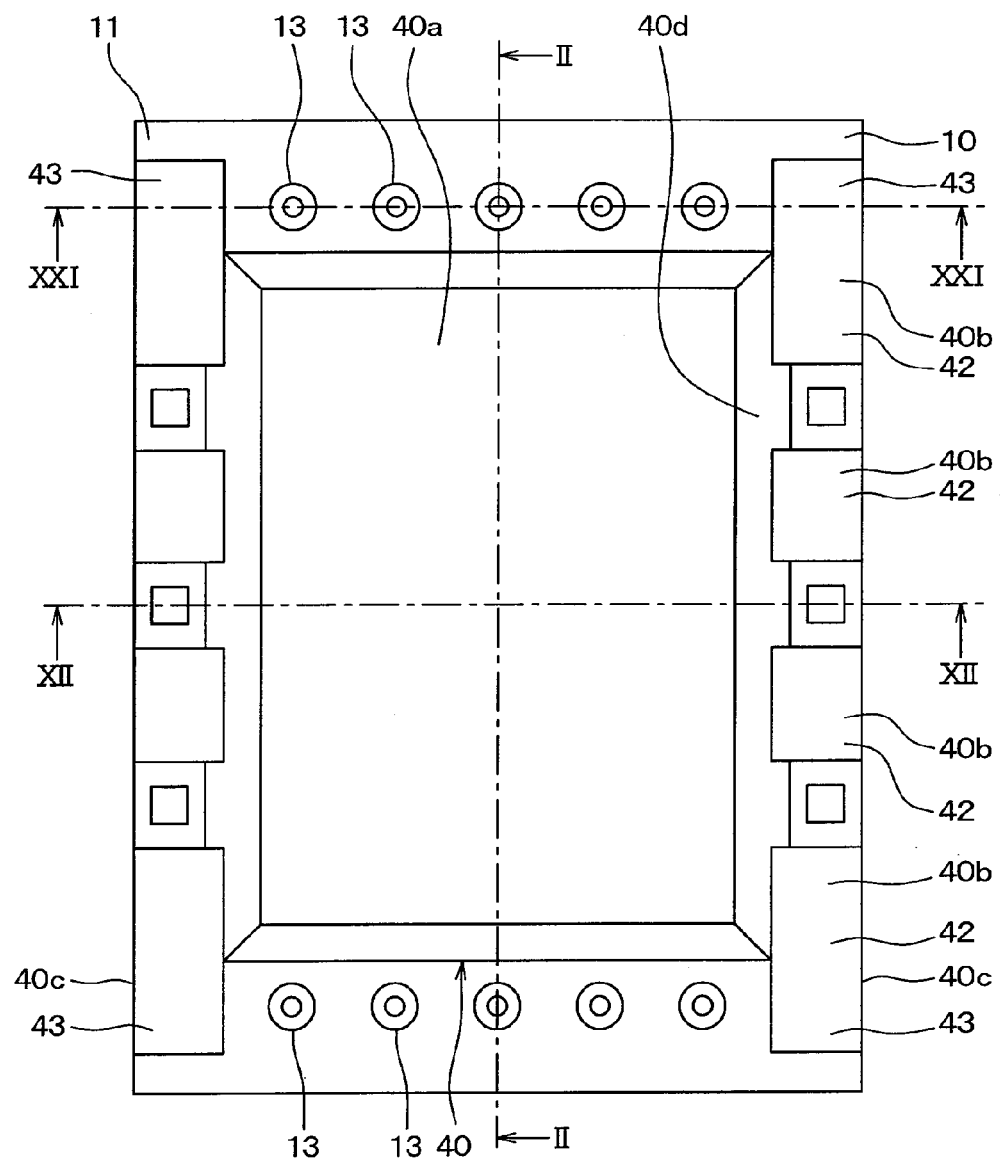
FIG. 22 is a plan view of the electronic device depicted in FIG. 21.
Figure 23:
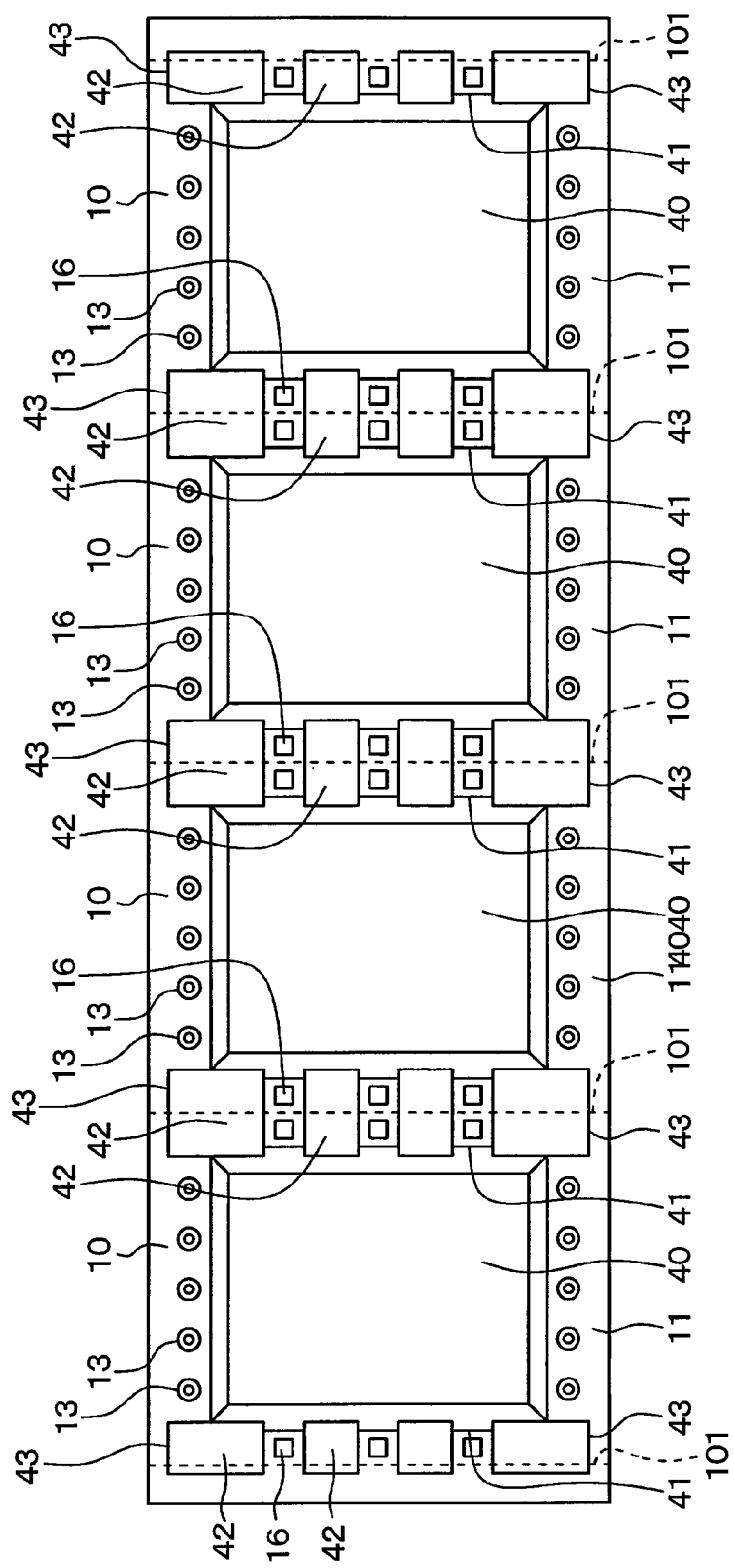
FIG. 23 is a plan view of a workpiece in the molding process depicted in (c) of FIG. 4 that is performed for the electronic device according to the fourth embodiment of the present disclosure.

As in FIG. 22, the fourth embodiment is configured so that the thin portion 42 is disposed on both sides of a portion of the mold resin 40 that seals the electronic parts 20, 30.

Figure 14:
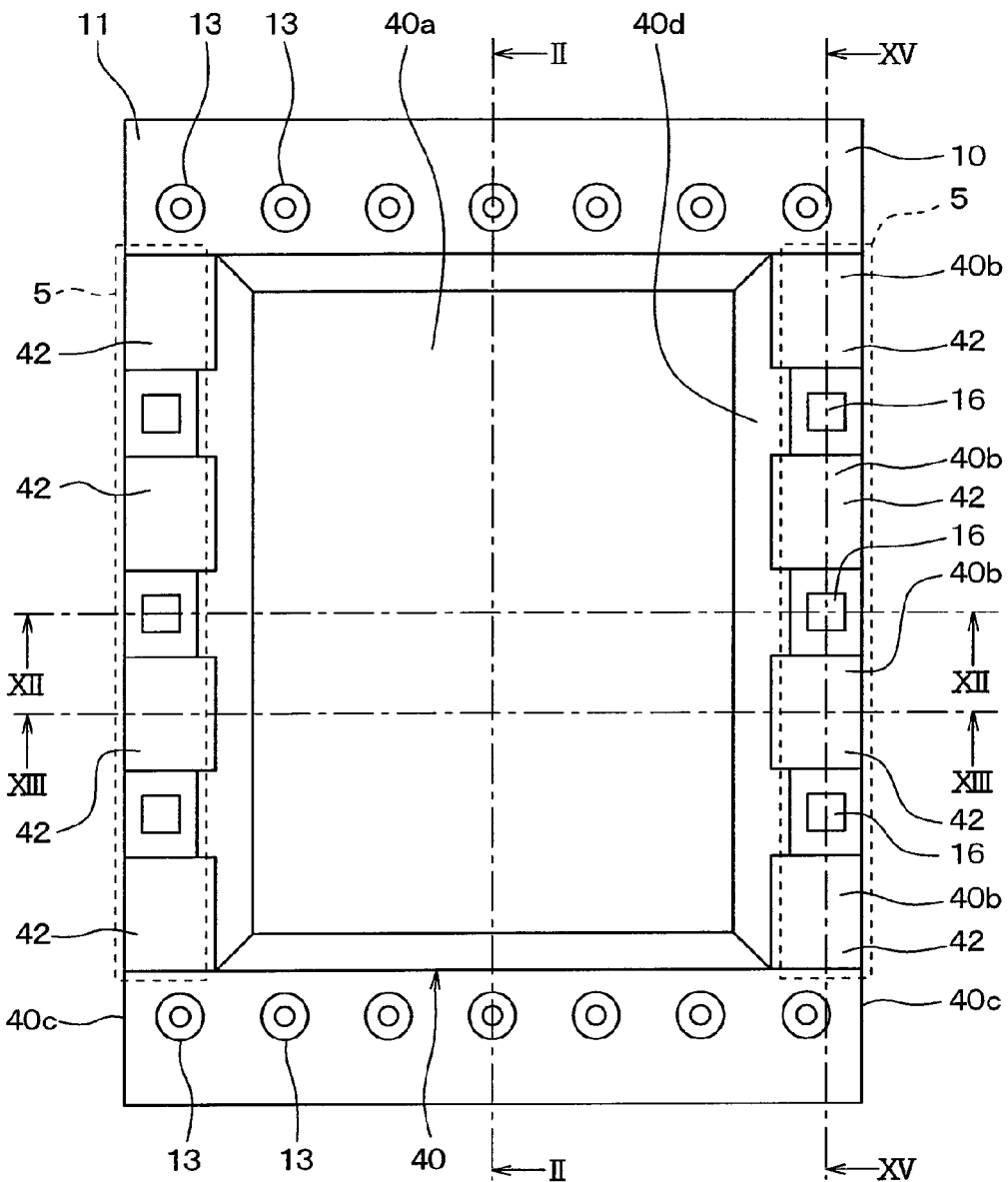
FIG. 14 is a plan view of the electronic device depicted in FIGS. 12, 13, and 15.

As in FIG. 14, the third embodiment is configured so that the thin portion 42 is not disposed in the longitudinal direction of the one surface 11 of the substrate 10 within a range where the through-holes 13 are located. In contrast, as in FIGS. 21 and 22, the thin portion 42 disposed on both sides as mentioned above is extended in the longitudinal direction of the one surface 11 of the substrate to be disposed in the range where the through-holes (hereinafter referred to as the second electrodes) 13 are located. Here, the thin portion 42 positioned on both sides are particularly disposed to include an end-to-end portion in the longitudinal direction of the one surface 11 of the substrate 10 containing the second electrodes 13. The thin portion 42 disposed on both sides therefore includes a mold protrusion 43 that protrudes outward from a portion of the mold resin 40 that seals the electronic parts 20, 30 in the direction of a boundary line between the one surface 11 of the substrate 10 and the cut surface (the third surface 40c). The second electrodes 13, which are different from the first electrodes, are disposed on the one surface 11 of the substrate 10 and positioned within a range between the mold protrusions 43 of the thin portions 42 disposed on both sides as described (the thin portions 42 having the mold protrusions 43).

As the periphery of the second electrodes 13 is a sealed region in the electronic device, the periphery has increased strength. The electronic device thus has improved vibration resistance.

Alternative Embodiments

The present disclosure is not limited to the foregoing embodiments and may be implemented in alternative embodiments, which are obtained by changing the foregoing embodiments as appropriate.

Figure 11:
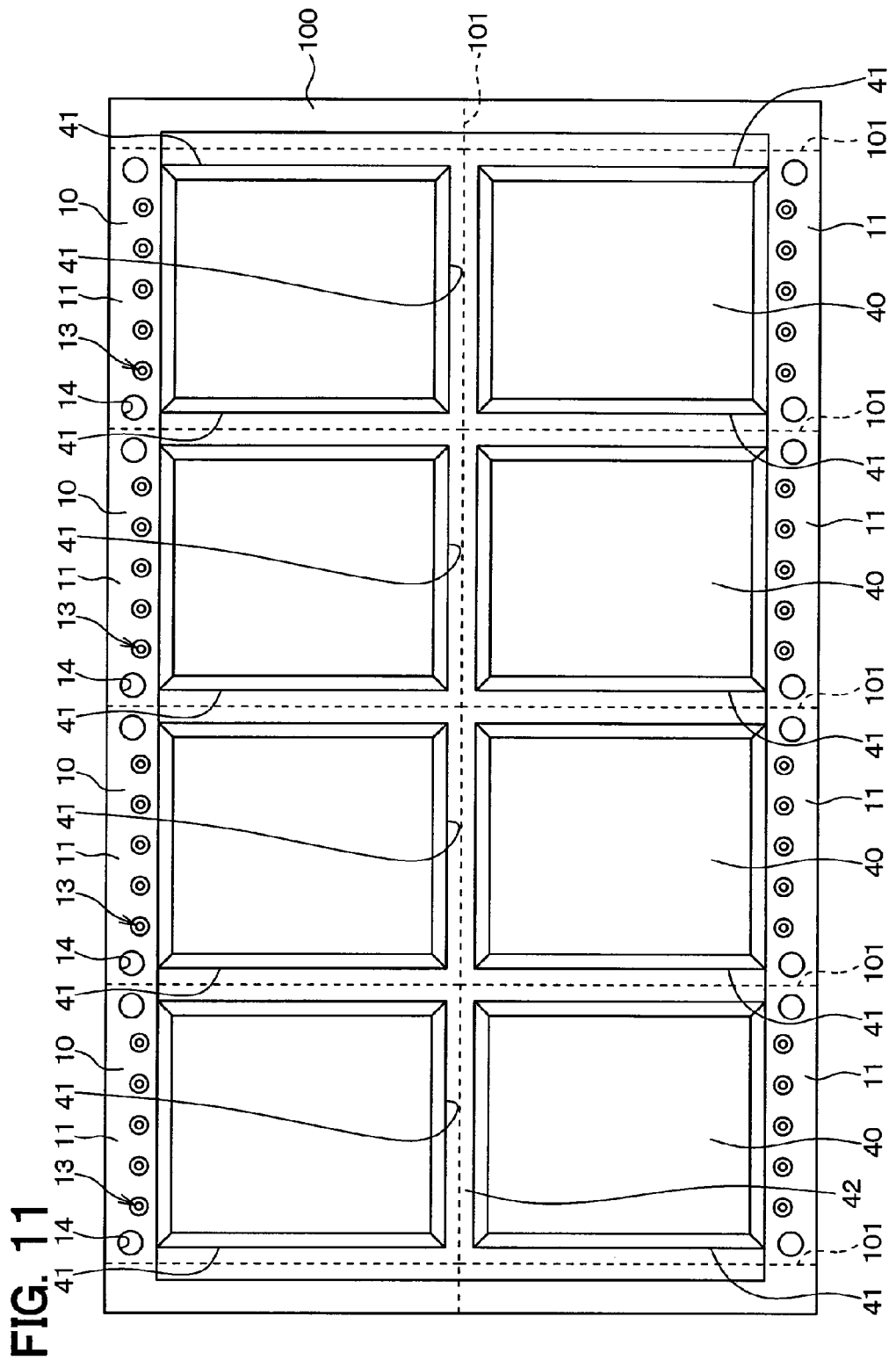
FIG. 11 is a plan view illustrating the process depicted in (c) of FIG. 4 in accordance with an alternative embodiment of the present disclosure.

The method for manufacturing the electronic device by using the multiple substrate 100 obtained by integrating four substrates 10 has been described in conjunction with the first embodiment. However, the multiple substrate 100 may include any number of substrates 10. For example, the electronic device may be manufactured by integrating eight substrates 10 and zoning the resultant multiple substrate 100 with the dicing lines 101 that are extended in the longitudinal direction and in a direction perpendicular to the longitudinal direction, as in FIG. 11. When the electronic device is manufactured by using the above-described multiple substrate 100, three lateral surfaces 10a, which are cut surfaces, are formed on each substrate 10, and three third surfaces 40c, which are cut surfaces, are formed on the mold resin 40. Similarly, the multiple substrate 100 may include any number of substrates 10 in the second embodiment as well.

In the foregoing embodiments, the fourth surface 40d, which joins the first surface 40a to the second surface 40b, and the fifth surface 40e, which joins the first surface 40a to the one surface 11 of the substrate 10, may be parallel to the normal line to the one surface 11 of the substrate 10. Further, the fourth surface 40d and the fifth surface 40e may have portions positioned toward the first surface 40a as surfaces parallel to the normal line to the one surface 11 of the substrate 10, and portions positioned toward the second surface 40b or the one surface 11 of the substrate as tapered surfaces tilted from the normal line to the one surface 11 of the substrate 10.

It is particularly preferred in the cutting process depicted in (d) of FIG. 4 that the dicing lines 101 at the rightmost and leftmost ends of a cross-section be placed at a position where the distance between the left end of the thin portion 42 and the related dicing line 101 is at least one-half the thickness of the thin portion 42. This instance facilitates the stability of a portion (an end of the multiple substrate 100) that becomes an end material after cutting. This inhibits the dicing blade from meandering when the end material flows and separates from the related dicing line.

Moreover, the first and second embodiments may be alternatively configured to include the mold protrusion 43 as in the fourth embodiment. This case provides the same advantageous effect as in the fourth embodiment. That is, the periphery of the second electrodes 13 in this alternative configuration is also a sealed region. The periphery thus has increased strength. This enables to provide the electronic device having improved vibration resistance.

Figure 24:
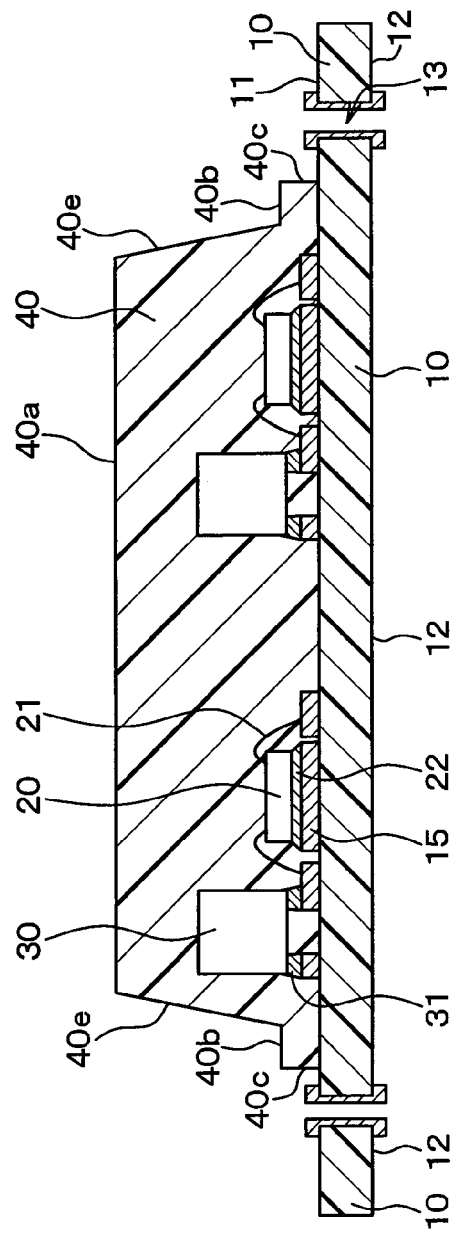
FIG. 24 is a cross-sectional view illustrating the electronic device according to a fifth embodiment of the present disclosure.
Figure 25:
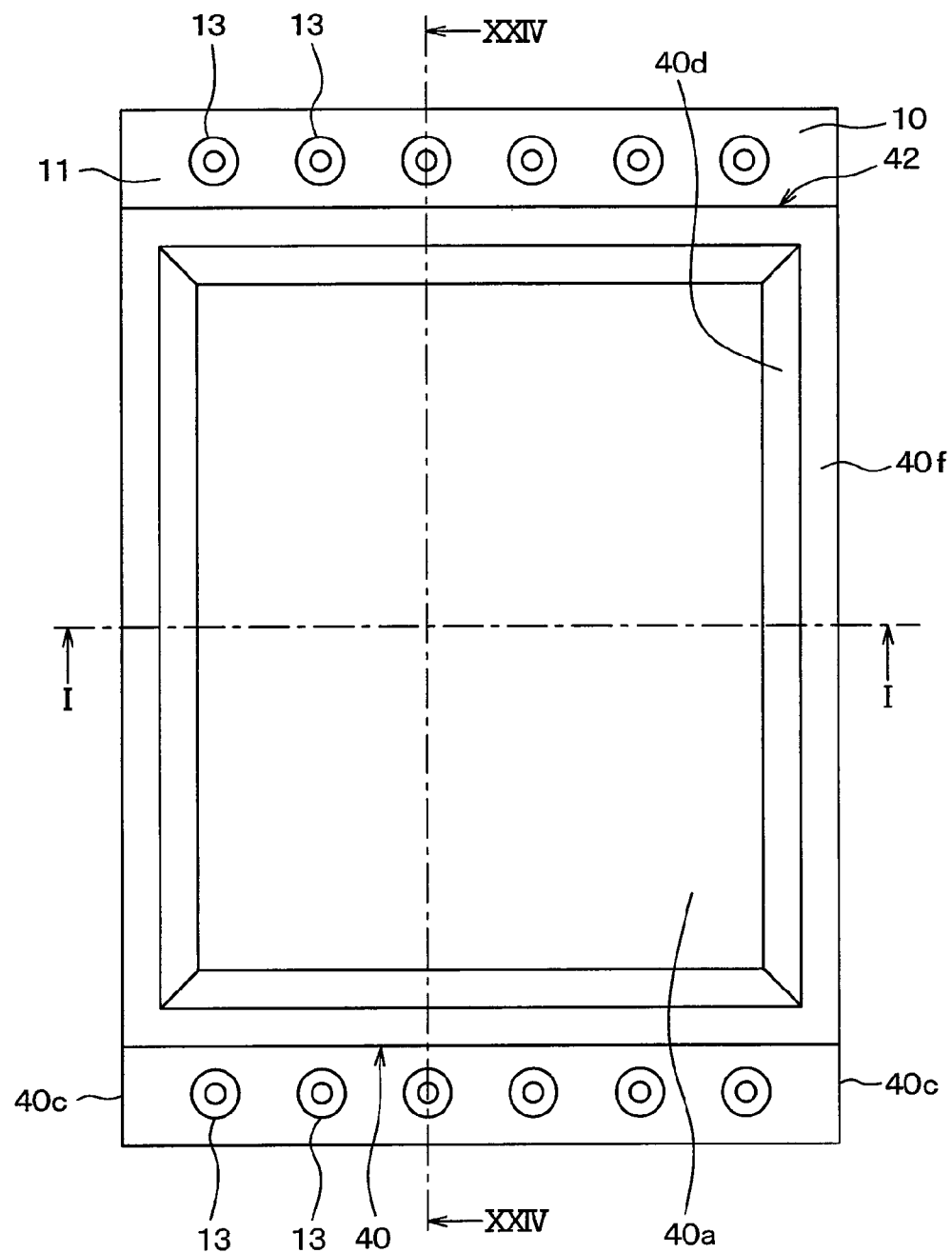
FIG. 25 is a plan view of the electronic device depicted in FIG. 24.

As in FIGS. 1, 24, and 25, when viewed in the direction of the normal line to the one surface 11 of the substrate 10, the thin portion 42 may include the second surface 40b parallel to the one surface 11 of the substrate 10 on the whole circumference of the outer rim of the mold resin 40 and be thinner than the thickness of a portion covering the electronic parts 20, 30. That is, the whole circumference of the outer rim of the mold resin 40 may be the second surface 40b, which is planar. As the outer rim of the mold resin 40 is planar, ultrasonic inspection can be performed. This enables to detect the separation of an end of the mold resin 40 from the substrate 10. Further, as the outer rim of the mold resin 40 is the thin portion 42 that is thinner than the thickness of the portion covering the electronic parts 20, 30, the stress generated between the substrate 10 and the mold resin 40 can be reduced to inhibit the separation of the mold resin as compared to a case where a portion of the mold resin 40 that seals the electronic parts 20, 30 has a fixed thickness.

Figure 26:
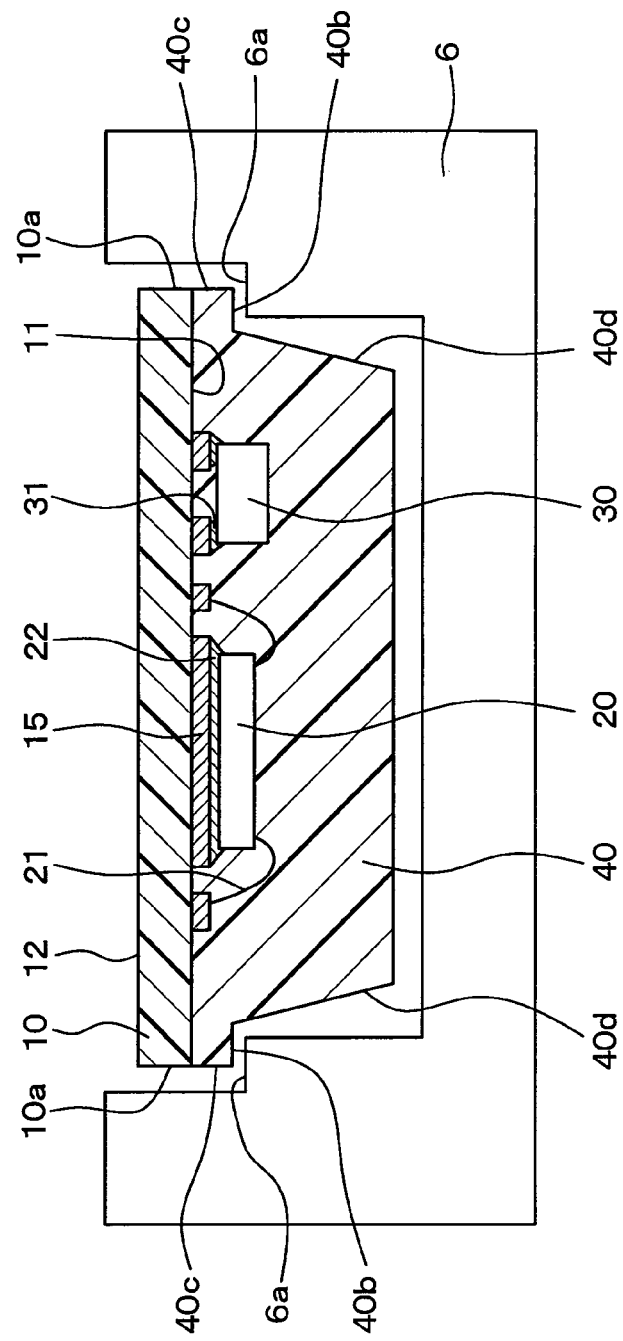
FIG. 26 is a cross-sectional view illustrating a state where the electronic device is placed in a magazine.

The electronic device according to the foregoing first to sixth embodiments is configured so that, when the electronic device is to be placed into a magazine 6, the second surface 40b, which is planar, can be brought into contact with a support surface 6a of the magazine 6 as in FIG. 26. Placing the electronic device into the magazine 6 might separate the mold resin 40 from the substrate 10. However, when the electronic device is placed into the magazine 6 in the above-described manner, the weight of the substrate 10 acts as a force that moves the substrate 10 toward the mold resin 40. The mold resin 40 is therefore not susceptible to separation from the substrate 10.

While the present disclosure has been described in conjunction with the foregoing embodiments, it is to be understood that the present disclosure is not limited to the foregoing embodiments and their structures. The present disclosure is intended to cover various exemplary modifications and equivalent modifications. In addition, various combinations and configurations and other combinations and configurations that additionally include only one element or more than one element or include a smaller number of elements are also within the spirit and scope of the present disclosure.

The invention claimed is:

1. An electronic device comprising:
a substrate having a first substrate face, a second substrate face opposite the first substrate face, and lateral substrate faces between the first substrate face and the second substrate face;
an electronics part mounted on the first substrate face; and
a mold resin that seals the electronic part and the first substrate face, wherein the second substrate face is exposed from the mold resin,
wherein:
at least one lateral surface of the substrate is a cut surface that is cut together with the mold resin;
the mold resin has a flush surface that is a surface cut together with the substrate and flush with the cut surface;
the mold resin includes a thin portion having (i) a parallel surface that is a surface parallel to the first substrate face and (ii) the flush surface joined with the parallel surface,
the thin portion of the mold resin being smaller in thickness than a sealing portion that is a portion of the mold resin sealing the electronic part, the sealing portion of the mold resin being positioned opposite the cut surface to cause the parallel surface to be interposed between (i) the sealing portion of the mold resin and (ii) the cut surface,
the electronic device further comprising
an alternately disposed portion disposing alternatively (i) a sealed region forming the thin portion of the mold resin and (ii) an exposed region not forming the thin portion, in a direction of a boundary line between the first substrate face of the substrate and the flush surface of the mold resin,
wherein a plurality of the exposed regions of the alternately disposed portion are respectively provided with a plurality of first electrodes on the first substrate face, the first electrodes being mutually differing in potential.

2. The electronic device according to claim 1, wherein the thin portion in the sealed region being disposed between the first electrodes is smaller in thickness than the first electrodes mutually differing in potential.

3. The electronic device according to claim 1, wherein:
the thin portion is further formed by a different sealed region, the different sealed region being opposite the sealing portion of the mold resin sealing the electronic part to cause the exposed region of the alternately disposed portion to be interposed between the different sealed region and the sealing portion of the mold resin sealing the electronic part; and
each of the first electrodes is surrounded by (i) the sealing portion of the mold resin sealing the electronic part, (ii)

the portion of the mold resin that is positioned in the sealed region of the alternately disposed portion, and (iii) a portion of the mold resin that is positioned in the different sealed region opposite the sealing portion of the mold resin sealing the electronic part.

4. The electronic device according to claim 1, wherein:

the thin portion includes a mold protrusion that is disposed on each of both sides of the sealing portion of the mold resin sealing the electronic part, the mold protrusion protruding outward than the sealing portion of the mold resin sealing the electronic part in the direction of the boundary line between the first substrate face and the flush surface of the mold resin that is flush with the cut surface; and second electrodes that are different from the first electrodes are mounted on the first substrate face as being disposed in a region between the mold protrusions.

* * * * *